(12) United States Patent
Lau et al.

(10) Patent No.: US 10,221,272 B2
(45) Date of Patent: Mar. 5, 2019

(54) PATTERNED POLYMERS AND DIRECTED POLYMER GROWTH BY INTIATED CHEMICAL VAPOR DEPOSITION

(71) Applicants: Kenneth Ka Shun Lau, Cherry Hill, NJ (US); Sruthi Janakiraman, Easton, PA (US); Chia-Yun Hsieh, Philadelphia, PA (US)

(72) Inventors: Kenneth Ka Shun Lau, Cherry Hill, NJ (US); Sruthi Janakiraman, Easton, PA (US); Chia-Yun Hsieh, Philadelphia, PA (US)

(73) Assignee: DREXEL UNIVERSITY, Philadelphia, PA (US)

( * ) Notice: Subject to any disclaimer, the term of this patent is extended or adjusted under 35 U.S.C. 154(b) by 0 days.

(21) Appl. No.: 15/613,854

(22) Filed: Jun. 5, 2017

(65) Prior Publication Data
US 2017/0350005 A1    Dec. 7, 2017

Related U.S. Application Data

(60) Provisional application No. 62/345,132, filed on Jun. 3, 2016.

(51) Int. Cl.
*B05D 3/06* (2006.01)
*C08F 271/02* (2006.01)
(Continued)

(52) U.S. Cl.
CPC .......... *C08F 271/02* (2013.01); *C08F 20/06* (2013.01); *C08F 26/10* (2013.01); *C23C 14/042* (2013.01);
(Continued)

(58) Field of Classification Search
CPC ........... B05D 5/00; C23C 13/06; C08F 12/12
See application file for complete search history.

(56) References Cited

U.S. PATENT DOCUMENTS 3,061,439 A   10/1962  Stone
4,673,569 A    6/1987  Shernov et al.
(Continued)

FOREIGN PATENT DOCUMENTS

CA         1178222 A     11/1984

OTHER PUBLICATIONS

Sigma Aldrich, 4-Vinylpyridine, contains 100 ppm hydroquinone as initiator, 95%, Retrieved on Apr. 5, 2017 from http://www.sigmaaldrich.com/catalog/product/aldrich/v3204?lang=en&region=US.
(Continued)

*Primary Examiner* — Julio J Maldonado
*Assistant Examiner* — Andre' C Stevenson
(74) *Attorney, Agent, or Firm* — Mendelsohn Dunleavy, P.C.

(57) ABSTRACT

A method of forming a patterned polymer layer on a substrate and a substrate having a polymer layer formed by the method. The method includes providing a substrate comprising a first surface having a first surface energy and a pattern located on the substrate forming a second surface having a second, lower surface energy than the first surface, and selectively depositing a polymeric layer onto the first surface using a monomer material in an initiated chemical vapor deposition process, wherein the initiated chemical vapor deposition process is operated under supersaturation conditions during the deposition process.

18 Claims, 21 Drawing Sheets

(51) Int. Cl.
*C08F 20/06* (2006.01)
*C08F 26/10* (2006.01)
*C23C 14/04* (2006.01)
*C23C 14/16* (2006.01)
*C23C 16/30* (2006.01)
*C23C 16/452* (2006.01)

(52) U.S. Cl.
CPC .............. *C23C 14/165* (2013.01); *C23C 16/30* (2013.01); *C23C 16/452* (2013.01)

(56) References Cited

U.S. PATENT DOCUMENTS

| | | | |
|---|---|---|---|
| 5,749,923 | A | 5/1998 | Olip et al. |
| 9,376,516 | B2 * | 6/2016 | Gupta ................... C08F 120/16 |
| 9,498,934 | B2 * | 11/2016 | Paxson .................... B05D 5/08 |
| 2010/0297251 | A1 * | 11/2010 | Timmons ............ A61K 9/5015 424/501 |
| 2012/0241015 | A1 * | 9/2012 | Hansen ..................... F17D 1/00 137/13 |
| 2013/0089734 | A1 * | 4/2013 | Nakamura ........... B32B 15/082 428/339 |
| 2016/0320701 | A1 * | 11/2016 | Cheng ....................... G03F 7/40 |

OTHER PUBLICATIONS

O'regan, Brian, and M. Grfitzeli. "A low-cost, high-efficiency solar cell based on dye-sensitized." nature 353.6346 (1991): 737-740.
Zhao, Hong, and Daniel Beysens. "From droplet growth to film growth on a heterogeneous surface: condensation associated with a wettability gradient." Langmuir 11.2 (1995): 627-634.
Bach, Udo, et al. "Solid-state dye-sensitized mesoporous TiO2 solar cells with high photon-to-electron conversion efficiencies." Nature 395.6702 (1998): 583-585.
O'Regan, Brian, et al. "A solid-state dye-sensitized solar cell fabricated with pressure-treated P25—TiO2 and CuSCN: Analysis of pore filling and IV characteristics." Chemistry of Materials 14.12 (2002): 5023-5029.
Hayama, Masayo, et al. "How polysulfone dialysis membranes containing polyvinylpyrrolidone achieve excellent biocompatibility?." Journal of membrane science 234.1 (2004): 41-49.
Chiba, Yasuo, et al. "Dye-sensitized solar cells with conversion efficiency of 11.1%." Japanese Journal of Applied Physics 45.7L (2006): L638.
Chan, Kelvin, et al. "Initiated chemical vapor deposition of polyvinylpyrrolidone-based thin films." Polymer 47.20 (2006): 6941-6947.
Beysens, Daniel. "Dew nucleation and growth." Comptes Rendus Physique 7.9-10 (2006): 1082-1100.
Chaubey, Aditya, et al. "Surface patterning: tool to modulate stem cell differentiation in an adipose system." Journal of Biomedical Materials Research Part B: Applied Biomaterials 84.1 (2008): 70-78.
Wu, Jihuai, et al. "Progress on the electrolytes for dye-sensitized solar cells." Pure and Applied Chemistry 80.11 (2008): 2241-2258.
Murugan, Ramalingam, et al. "Biomaterial surface patterning of self-assembled monolayers for controlling neuronal cell behaviour." International journal of biomedical engineering and technology 2.2 (2009): 104-134.

Ozaydin-Ince, Gozde, and Karen K. Gleason. "Transition between kinetic and mass transfer regimes in the initiated chemical vapor deposition from ethylene glycol diacrylate." Journal of Vacuum Science & Technology A: Vacuum, Surfaces, and Films 27.5 (2009): 1135-1143.
Nejati, Siamak, and Kenneth KS Lau. "Pore filling of nanostructured electrodes in dye sensitized solar cells by initiated chemical vapor deposition." Nano letters 11.2 (2010): 419-423.
Stalder, Aurélien F., et al. "Low-bond axisymmetric drop shape analysis for surface tension and contact angle measurements of sessile drops." Colloids and Surfaces A: Physicochemical and Engineering Aspects 364.1 (2010): 72-81.
Kadajji, Veeran Gowda, and Guru V. Betageri. "Water soluble polymers for pharmaceutical applications." Polymers 3.4 (2011): 1972-2009.
Bose, Ranjita K., and Kenneth KS Lau. "Initiated chemical vapor deposition of poly (2-hydroxyethyl methacrylate) hydrogels." Thin Solid Films 519.14 (2011): 4415-4417.
Nejati, Siamak, and Kenneth KS Lau. "Integration of polymer electrolytes in dye sensitized solar cells by initiated chemical vapor deposition." Thin Solid Films 519.14 (2011): 4551-4554.
Wang, Guorong, et al. "Physicochemical and functional properties, microstructure, and storage stability of whey protein/ polyvinylpyrrolidone based glue sticks." BioResources 7.4 (2012): 5422-5434.
Rodríguez, Jorge, et al. "Polyvinylpyrrolidone—LiClO 4 solid polymer electrolyte and its application in transparent thin film supercapacitors." Journal of Power Sources 237 (2013): 270-276.
Mitra, Jaba, et al. "Scaffolds for bone tissue engineering: role of surface patterning on osteoblast response." RSC Advances 3.28 (2013): 11073-11094.
Nejati, Siamak. Oxidative and Initiated Chemical Vapor Deposition of Polymer Electronic Materials for Applications in Energy Conversion and Storage. Diss. Drexel University, 2013.
Petersen, Svea, et al. "Development and in vitro characterization of photochemically crosslinked polyvinylpyrrolidone coatings for drug-coated balloons." Coatings 3.4 (2013): 253-267.
Mathew, Simon, et al. "Dye-sensitized solar cells with 13% efficiency achieved through the molecular engineering of porphyrin sensitizers." Nature chemistry 6.3 (2014): 242-247.
Lin, H. B., et al. "LiNi 0.5 Mn 1.5 O 4 nanoparticles: synthesis with synergistic effect of polyvinylpyrrolidone and ethylene glycol and performance as cathode of lithium ion battery." Journal of Power Sources 257 (2014): 37-44.
Smolin, Yuriy Y., et al. "Effects of polymer chemistry on polymer-electrolyte dye sensitized solar cell performance: A theoretical and experimental investigation." Journal of Power Sources 274 (2015): 156-164.
Tao, Ran, and Mitchell Anthamatten. "Condensation and polymerization of supersaturated monomer vapor." Langmuir 28.48 (2012): 16580-16587.
Nie, Zhihong, and Eugenia Kumacheva. "Patterning surfaces with functional polymers." Nature materials 7.4 (2008): 277-290.
Janakiraman, Sruthi. Initiated Chemical Vapor Deposition of Poly (vinylpyrrolidone) Thin Films: Synthesis, Characterization, and Applications. Diss. Drexel University, 2015, 91 pages.
Guo, L. Jay. "Nanoimprint Lithography: Methods and Material Requirements." Adv. Mater 19 (2007): 495-513.
Piner, Richard D. ""Dip-Pen" Nanolithography." science 283 (1999): 661-661.

* cited by examiner

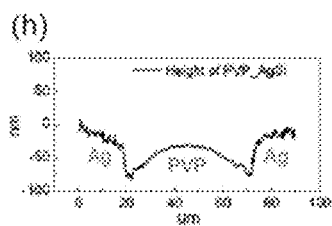
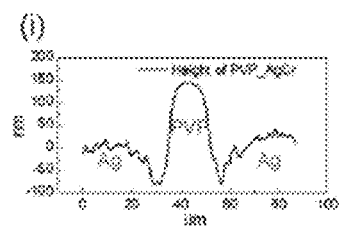
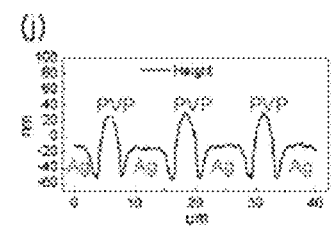
FIG. 16h         FIG. 16i         FIG. 16j
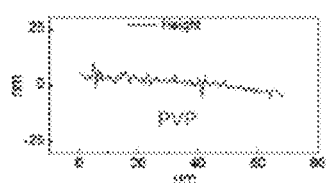
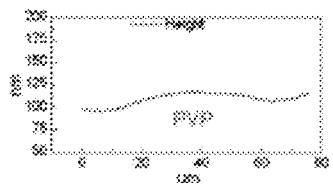
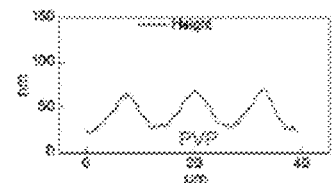
FIG. 16k         FIG. 16l         FIG. 16m
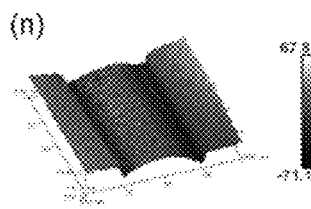
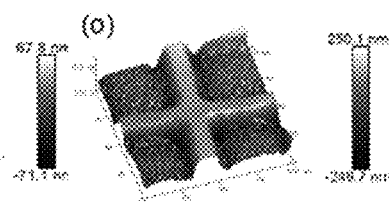
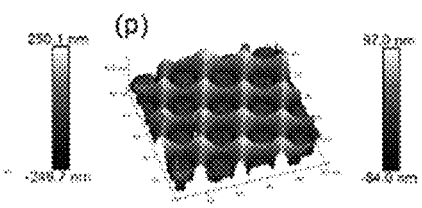
FIG. 16n         FIG. 16o         FIG. 16p

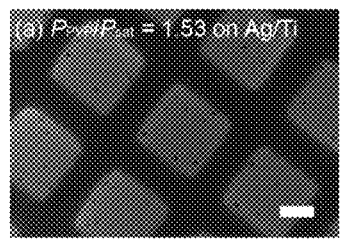 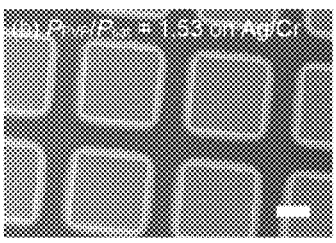 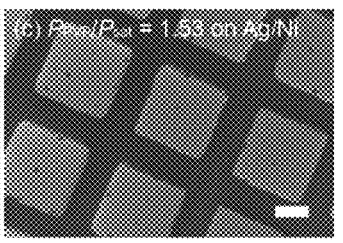
FIG. 18a  FIG. 18b  FIG. 18c
  
FIG. 19a  FIG. 19b  FIG. 19c

PATTERNED POLYMERS AND DIRECTED POLYMER GROWTH BY INTIATED CHEMICAL VAPOR DEPOSITION

RELATED APPLICATION DATA

This application claims the benefit of U.S. Provisional Application No. 62/345,132, filed on Jun. 3, 2016, the entire disclosure of which is hereby incorporated by reference as if set forth fully herein.

STATEMENT OF GOVERNMENT INTEREST

This invention was made with government support under Award Number CBET-1510888 awarded by the National Science Foundation. The Government has certain rights in the invention.

BACKGROUND OF THE INVENTION

1. Field of the Invention

The present invention is directed to patterned polymers and a method of forming patterned polymer substrates using initiated chemical deposition operated under supersaturated conditions.

2. Description of the Related Technology

Poly(vinylpyrrolidone) or PVP is a water soluble polymer made by the polymerization of N-vinylpyrrolidone (VP). With a molecular weight (Mw) ranging from 2500 to 1 million, PVP is mainly produced using free radical addition polymerization. Vinylpyrrolidone can be polymerized using organic peroxide initiators, such as di-tert-butyl-peroxide (TBPO) or dicumyl peroxide. In the liquid phase, polymerization is initiated by solvent radicals that are produced through hydrogen abstraction from alkoxy radicals formed by initiator decomposition. Chain propagation then occurs normally and termination occurs through hydrogen abstraction to form an alkyl end group and a solvent radical. The solvent radical reinitiates the polymerization process to form a new chain.

PVP has several important properties that provide versatility for use in a variety of industrial applications. Commercially available PVP polymers are highly polar, amphiphilic and compatible with a variety of resins and electrolytes. PVP also has adhesive and cohesive properties, is physiologically inert and is also cross-linkable and can be used to produce hard, glossy, oxygen permeable films which can adhere to a variety of substances. PVP is also soluble in water as well as in various organic solvents due to its combination of both hydrophobic and hydrophilic functional groups, which makes interactions with a wide variety of solvents possible. Commercially produced PVP is soluble in most polar solvents and insoluble in less polar solvents. However, PVP produced without water can also be dissolved in solvents such as dioxane, acetone and toluene.

PVP can be used in fields such as pharmaceuticals, cosmetics, foods, adhesives, textiles and the renewable energy industry. In pharmaceuticals PVP is used as a binder, a coating and disintegrant for tablets, and a solubilizer for drug suspensions. PVP is a stabilizer in the beverage industry. For uses in the pharmaceutical and beverage industry, the interaction between PVP and low molecular weight compounds is crucial. PVP has a tendency to form complexes with different compounds (inorganic anions, amino acids, phenols and proteins) and polymers of both low and high molecular weights. This property can sometimes be beneficial because PVP can solubilize insoluble substances. However, for the pharmaceutical industry strong complexes can reduce the bioavailability of the active substance. Therefore, interactions between drug compounds and PVP have to be investigated thoroughly before use.

For the cosmetic field, PVP is used as a film former in hair sprays, lotions and conditioning shampoos. It is also used in glue sticks as an adhesive to improve strength and toughness. In the textile industry, PVP is utilized as a dye-affinitive stripping and leveling agent. It also has uses as a polymer thin film in supercapacitors and as a polymer gel electrolyte in dye sensitized solar cells. PVP is a versatile polymer that has the potential for many new applications.

Initiated chemical vapor deposition (iCVD) is a technique used to deposit polymer thin films under vacuum. Monomer and initiator vapors flow into the reactor where a heated filament, located inside the chamber, activates the initiator. Next, both the activated initiator and monomer adsorb onto the surface of the substrate. The activated initiator then begins the polymerization process by linking monomer units together to form the polymer chain. A schematic representation of the iCVD process is shown in FIG. 1. The advantages of iCVD include its lower temperature of operation compared to other hot wire CVD techniques as well as the relative chemical purity and physical uniformity of polymer films produced on surfaces by iCVD.

iCVD is a proven technique for numerous applications, including hydrogels, solar cells, sensors, and various thin film coatings. Compared to other film deposition techniques, like spin coating, iCVD does not use liquid solvents during processing. This is particularly attractive as the use of liquid solvents during processing can often result in a decrease in cell performance from solvent residue and solvent incompatibilities with existing cell components. Also, the iCVD process occurs in a single step, enabling simultaneous polymerization and coating deposition, and provides the necessary physical and chemical control needed for device fabrication.

The deposition rate of polymers using iCVD may be limited by the monomer availability at the surface. Therefore, a lower substrate temperature results in faster deposition as this increases monomer adsorption. The amount of monomer adsorption can be expressed in terms of the fractional saturation at the surface, which is the ratio of the monomer's partial pressure to its saturated vapor pressure $(P_m/P_{sat})$ at the temperature of the surface. At low values of $P_m/P_{sat}$, monomer adsorption corresponds to less than one layer of film and the surface concentration increases linearly with $P_m/P_{sat}$. At higher values of $P_m/P_{sat}$, there is multilayer adsorption of monomer. At a $P_m/P_{sat}>1$, or supersaturated conditions, the monomer is known to condense on the surface. Typically, under supersaturated conditions, films are not smooth and uniform due to the formation of condensed, coalesced monomer droplets. Therefore, to avoid condensation and in order to produce uniform, homogeneous films, iCVD is usually run at intermediate $P_m/P_{sat}$ conditions of between 0.4-0.8 to ensure a reasonable deposition rate. See, Lau, K. K. S, Gleason, "Initiated chemical vapor depositions (iCVD) of Poly(alkyl acrylates): a kinetic model," *Macromolecules* 39 (2006) 3688-3694.

There are only a few studies that have been done to examine the deposition behavior and morphology of films produced under supersaturated conditions $(P_m/P_{sat}>1)$. See, Tao, R., Anthamatten, M., "Condensation and polymerization of supersaturated monomer vapor," *Langmuir* 28 (2012) 16580-16587. In the deposition of poly(glycidyl methacrylate) (PGMA) films under supersaturated conditions, surface undulations were observed. As the level of supersaturation increased (greater $P_m/P_{sat}$ values) the period and amplitude of the undulations increased as well. This may be due to the monomer condensing on the substrate followed by the nucleation of droplets and film growth.

One of the most important properties of monomer condensation is the wettability of the solid surface with the condensing liquid. Wettability can be quantified using the contact angle of the liquid on the solid. It has been shown that depending on the wetting properties of the solid surface, liquid condensation can occur either in the form of a droplet or a thin film. If complete wetting is achieved by the liquid, condensation will occur as a thin film, otherwise droplets and islands will form. See, Zhao, H., Beysens, D., "From droplet growth to film growth on a heterogeneous surface: condensation associated with a wettability gradient." *Langmuir* 11 (1995) 627-634.

With the accelerated development of micro- and nanoscale systems, there is a concurrent need for more effective fabrication approaches. Particularly for soft organic polymer in micro- and nanoelectromechanical systems (MEMS, NEMS), hybrid organic-inorganic systems, organic semiconductor electronics, organic photovoltaics, and optoelectronic devices, there is a need for suitable polymer patterning techniques to create well-designed micro- and nanostructured surfaces with well-maintained polymer properties.

Diverse strategies in polymer patterning have been reported and reviewed. In general, the current strategies can be divided into five approaches: (1) molding, (2) photolithography, (3) stamping, (4) self-organization, and (5) direct writing. The molding approach employs elastomeric molds to stamp or print a liquid precursor solution on defined locations. It is capable of patterning polymers on the nanoscale but requires time for the precursor solution to diffuse into the microchannels of the mold and dry. See, Guo, L. J., "Nanoimprint Lithography: Methods and Material Requirements." *Advanced Materials* (2007), 19, 495-513. In the photolithography approach, polymer patterns can be sharp and made with a high throughput but it requires solvent-based photoresists and possibly causes polymer material damage from radicals generated during UV irradiation are undesirable. See, Jensen, J.; Dyer, A. L.; Shen, D. E.; Krebs, F. C.; Reynolds, J. R., "Direct Photopatterning of Electrochromic Polymers." *Advanced Functional Materials* (2013), 23, 3728-3737. The stamping approach generates a chemically contrasted surface by "ink" solutions. Therefore, solvent evaporation is needed between each stamping step thereby slowing down throughput. In self-organization, polymer patterns are highly periodic and defect-free but they are hard to design since the patterns are strongly dependent on polymer physics and chemistry. See, Nurmawati, M. H.; Renu, R.; Ajikumar, P. K.; Sindhu, S.; Cheong, F. C.; Sow, C. H.; Valiyaveettil, S., "Amphiphilic Poly(p-phenylene)s for Self-Organized Porous Blue-Light-Emitting Thin Films." *Advanced Functional Materials* (2006), 16, 2340-2345. Besides, designed polymers need to be dissolved for film spreading, which requires solvent removal. The direct writing approach, such as dip-pen nanolithography can write nanoscale patterns directly on a surface by using a nanoscale probe tip with the desired material solution. See, Piner, R. D.; Zhu, J.; Xu, F.; Hong, S.; Mirkin, C. A., "Dip-Pen Nanolithography." *Science*(1999), 283, 661. However, throughput is relatively slow. For all of the currently available approaches, polymer patterns are made using solvent-based procedures requiring solvent removal.

Currently, photolithography is the most common method of patterning thin films. Photolithography is an optical technique to transfer patterns from a photomask to a polymer layer coated on a substrate. The desired pattern is first applied on a photoresist layer. The pattern is then developed into a mask that creates a patterned film by selectively etching the underlying layer. The whole process involves surface preparation, coating, pre-bake, alignment, exposure, development, post-bake, processing using the photoresist as a masking film, stripping and finally post process cleaning. Photolithography needs to be done in a clean room and the process is long and tedious. Spin coating is the most common coating method used. However, problems such as drying during spinning increases the viscosity of the resist edges. The edges can be up to 20-30 times the average thickness of the resist. There is also a high possibility of streaks, which are caused by particles with a diameter greater than the thickness of the photoresist layer. See, Fransilla, S., *Lithography*, in "Introduction to Microfabrication," W. Sussex, UK: John Wiley & Sons Ltd. 2004, ch. 9, sec. 9.1-9.4, pp. 99-103. All of these defects reduce the quality of the pattern.

Surface patterning has many biological application such as tissue scaffolding, stem cell research, and to control cell behavior. What is needed is an easier, faster alternative to photolithography for patterning polymer thin films.

SUMMARY OF THE INVENTION

The invention is directed to a method of forming a patterned polymer layer on a substrate by providing a substrate comprising a first surface having a first surface energy and a pattern located on the substrate forming a second surface having a second, lower surface energy than the first surface. The method also includes selectively depositing a polymeric layer onto the first surface using a monomer material in an initiated chemical vapor deposition process, wherein the initiated chemical vapor deposition process is operated under supersaturation conditions during the deposition process.

In the foregoing embodiment, the first surface energy may be at least 10% greater than the second surface energy, preferably the first surface energy is least 10% to about 400% greater than the second surface energy, and most preferably, the first surface energy at least 100% greater than the second surface energy.

In each of the foregoing embodiments the first surface may be mostly wetting and the second surface is mostly non-wetting. In the foregoing embodiments, the contact angle between the monomer and the first surface is lower than about 10°, and the contact angle between the monomer and the second surface is higher than about 10°.

In each of the foregoing embodiments, the first surface energy may be greater than about 1.5 J.m$^{-2}$, and preferably, the first surface energy is in the range of about 1.7 to about 2.4 J.m$^{-2}$.

In each of the forgoing embodiments, the second, lower surface energy is lower than about 1.5 J.m$^{-2}$, and preferably, the second, lower surface energy is in the range of about 0.7 to about 1.3 J.m$^{-2}$.

In each of the foregoing embodiments, the first surface may include a material selected from the group consisting of titanium, chromium, silicon, nickel, and platinum. Preferably, the first surface comprises silicon. In each of the foregoing embodiments, the second surface may include silver, gold or tin. Preferably, the second surface comprises silver. In each of the foregoing embodiments, the polymer may also be poly(methyl methacrylate), poly(styrene), poly (vinylimidazole), and poly(vinylpyrrolidone), preferably, the polymer is poly(vinylpyrrolidone).

In each of the foregoing embodiments, the substrate may be made placing a mask onto the first surface to define a pattern; depositing a second material having a second surface energy onto the first surface containing the mask; and removing the mask. The mask may be a transmission electron microscopy grid and the mask may comprise nickel. The substrate may be obtained by depositing the second substrate using an evaporation method.

In each of the foregoing embodiments, the initiated chemical vapor deposition process may be operated at conditions that result in a fractional saturation $P_m/P_{sat}$ of the monomer in a range of greater than 1 to about 2, preferably the fractional saturation $P_m/P_{sat}$ of the monomer is about 1.2 to about 1.6.

In each of the foregoing embodiments the initiated chemical deposition process may be carried out in a vacuum reactor kept at a constant pressure between about 0.1 Ton and about 100 Ton. The substrate may also be held at a constant temperature in the range of about −15° C. to about 25° C.

In each of the foregoing embodiments, the monomer and an initiator may be introduced to the depositing step as vapors. The monomer may preferably be introduced to the depositing step at a flow rate between about 0.1 sccm and about 100 sccm, and the initiator may be introduced to the depositing step at a flow rate between about 0.1 sccm and about 10 sccm.

Another embodiment of the invention includes a patterned polymer substrate formed by the method described in any of the foregoing embodiments.

BRIEF DESCRIPTION OF THE DRAWINGS

FIG. 12b is a close-up SEM image of patterns of the TEM grid of FIG. 12a.

FIG. 12c is a different close-up SEM image of patterns of the TEM grid of FIG. 12a.

FIG. 12d is a different close-up SEM image of patterns of the TEM grid of FIG. 12a.

FIG. 16h shows AFM line traces cutting across the white line in FIG. 16e.

FIG. 16i shows AFM line traces cutting across the white line in FIG. 16f.

FIG. 16j shows AFM line traces cutting across the white line in FIG. 16g.

FIG. 16k shows AFM line traces cutting across the black line in FIG. 16e.

FIG. 16l shows AFM line traces cutting across the black line in FIG. 16f.

FIG. 16m shows AFM line traces cutting across the black line in FIG. 16g.

FIG. 16n is an AFM 3D projection corresponding to the SEM image of 16b.

FIG. 16o is an AFM 3D projection corresponding to the SEM image of 16c.

FIG. 16p is an AFM 3D projection corresponding to the SEM image of 16d.

FIG. 18a is an SEM image of PVP deposition on compositional surface of Ag/Ti at pattern of L×S=38 μm×26 μm. Scale bar=20 μm.

FIG. 18b is an SEM image of PVP deposition on compositional surface of Ag/Cr at pattern of L×S=38 μm×26 μm. Scale bar=20 μm.

FIG. 18c is an SEM image of PVP deposition on compositional surface of Ag/Ni at pattern of L×S=38 μm×26 μm. Scale bar=20 μm.

FIG. 19a is an SEM image of AG/Si sample (7.5 μm×5 μm) after iCVD PHEMA reactions under $P_m/P_{sat}$ of 1.03. Scale bar=20 μm.

FIG. 19b is an SEM image of AG/Si sample (7.5 μm×5 μm) after iCVD PHEMA reactions under $P_m/P_{sat}$ of 1.71. Scale bar=20 μm.

FIG. 19c is an SEM image of AG/Si sample (7.5 μm×5 μm) after iCVD PHEMA reactions under $P_m/P_{sat}$ of 2.11. Scale bar=20 μm.

DETAILED DESCRIPTION OF THE PREFERRED EMBODIMENT(S)

Figure 1:
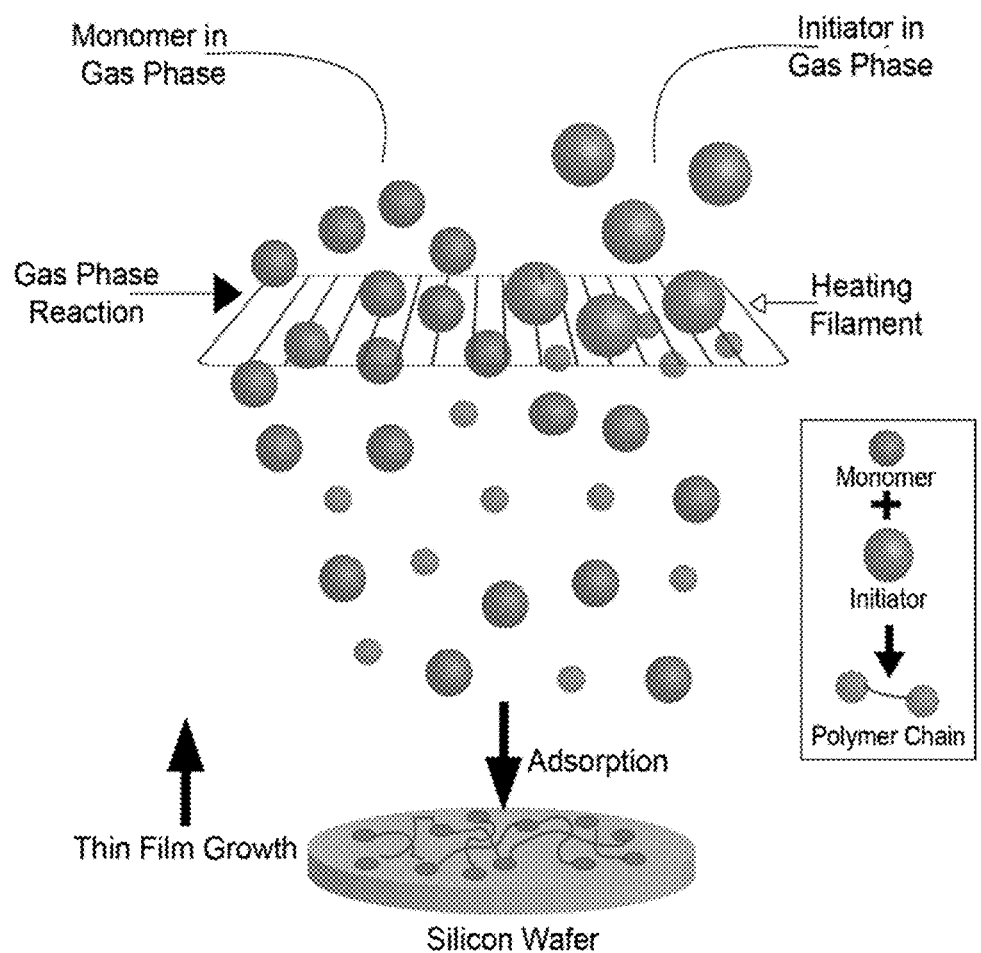
FIG. 1 shows a schematic representation of iCVD.

For illustrative purposes, the principles of the present disclosure are described by referencing various exemplary embodiments. Although certain embodiments are specifically described herein, one of ordinary skill in the art will readily recognize that the same principles are equally applicable to, and can be employed in other systems and methods.

Before explaining the disclosed embodiments of the present disclosure in detail, it is to be understood that the disclosure is not limited in its application to the details of any particular embodiment shown. Additionally, the terminology used herein is for the purpose of description and not of limitation. Furthermore, although certain methods are described with reference to steps that are presented herein in a certain order, in many instances, these steps may be performed in any order as may be appreciated by one skilled in the art; the novel methods are therefore not limited to the particular arrangement of steps disclosed herein.

It must be noted that as used herein and in the appended claims, the singular forms "a", "an", and "the" include plural references unless the context clearly dictates otherwise. Furthermore, the terms "a" (or "an"), "one or more" and "at least one" can be used interchangeably herein. The terms "comprising", "including", "having" and "constructed from" can also be used interchangeably.

Unless otherwise indicated, all numbers expressing quantities of ingredients, properties such as molecular weight, percent, ratio, reaction conditions, and so forth used in the specification and claims are to be understood as being modified in all instances by the term "about," whether or not the term "about" is present. Accordingly, unless indicated to the contrary, the numerical parameters set forth in the specification and claims are approximations that may vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements.

It is to be understood that each component, compound, substituent or parameter disclosed herein is to be interpreted as being disclosed for use alone or in combination with one or more of each and every other component, compound, substituent or parameter disclosed herein.

It is also to be understood that each amount/value or range of amounts/values for each component, compound, substituent or parameter disclosed herein is to be interpreted as also being disclosed in combination with each amount/value or range of amounts/values disclosed for any other component(s), compounds(s), substituent(s) or parameter(s) disclosed herein and that any combination of amounts/values or ranges of amounts/values for two or more component(s), compounds(s), substituent(s) or parameters disclosed herein are thus also disclosed in combination with each other for the purposes of this description.

It is further understood that each range disclosed herein is to be interpreted as a disclosure of each specific value within the disclosed range that has the same number of significant digits. Thus, a range of from 1-4 is to be interpreted as an express disclosure of the values 1, 2, 3 and 4. It is further understood that each lower limit of each range disclosed herein is to be interpreted as disclosed in combination with each upper limit of each range and each specific value within each range disclosed herein for the same component, compounds, substituent or parameter. Thus, this disclosure to be interpreted as a disclosure of all ranges derived by combining each lower limit of each range with each upper limit of each range or with each specific value within each range, or by combining each upper limit of each range with each specific value within each range.

Furthermore, specific amounts/values of a component, compound, substituent or parameter disclosed in the description or an example is to be interpreted as a disclosure of either a lower or an upper limit of a range and thus can be combined with any other lower or upper limit of a range or specific amount/value for the same component, compound, substituent or parameter disclosed elsewhere in the application to form a range for that component, compound, substituent or parameter.

All documents mentioned herein are hereby incorporated by reference in their entirety or alternatively to provide the disclosure for which they were specifically relied upon. The applicant(s) do not intend to dedicate any disclosed embodiments to the public, and to the extent any disclosed modifications or alterations may not literally fall within the scope of the claims, they are considered to be part hereof under the doctrine of equivalents.

iCVD provides the possibility of patterning under supersaturated conditions in a simple four step process without the use of a clean room. The present application provides a description of the effect on PVP deposition at supersaturated conditions on substrates with different surface conditions and the potential patterning applications of this technology.

The present invention uses initiated chemical vapor deposition (iCVD) as an accessible and rapid polymer patterning approach. iCVD is a solvent-free, single-step technique for producing polymers on surfaces through the surface polymerization of monomer adsorbed from the vapor phase. A series of heated filament wires are utilized to activate an initiator for initiating polymer growth. As an adsorption-limited process, the polymerization rate is generally proportional to the amount of adsorbed monomer on the surface, which is measured using the ratio of the monomer partial pressure to its saturated pressure at the substrate surface, $P_m/P_{sat}$. When $P_m/P_{sat}<1$, monomer is below saturation point and polymer growth is through direct gas-to-solid reactions, which is generally the normal iCVD operating mode. When $P_m/P_{sat}\geq 1$, monomer reaches saturation and becomes supersaturated above a ratio of 1.

An important parameter influencing iCVD deposition rate as will be discussed herein is the fractional saturation $P_m/P_{sat}$ ratio of the monomer partial pressure, $P_m$, and the monomer saturation pressure, $P_{sat}$, determined at the substrate temperature. $P_m$ was calculated as the total reactor pressure multiplied by the fraction of the monomer flow to the total molar flow, and $P_{sat}$ was calculated from the Clausius-Clapeyron equation based on a fit to literature vapor pressure data.

Monomer supersaturation ($P_m/P_{sat}>1$) affects the morphology and deposition rate of PVP on substrates with various wetting properties. For substrates with higher monomer contact angles, polymer growth rate is near-zero. Therefore, by utilizing the differences in growth under supersaturated conditions due to differences in surface wettabilities, selective deposition of polymer using iCVD can be successfully performed.

By performing iCVD under super saturated monomer conditions ($P_m/P_{sat}>1$), selective polymer deposition and growth can be achieved on surfaces that favor wetting of the monomer. A key factor influencing selectivity is the differential wettability of dissimilar surface materials. A larger difference in surface energy between the two materials likely drives the monomer to the higher energy surface, leading to selective growth on this material. For example, under supersaturation conditions, the deposition rate of iCVD poly (vinylpyrrolidone) (PVP) decreased significantly, to the point where for some surfaces, like silver, the deposition became almost negligible. With the ability to suppress deposition on substrates such as silver but not silicon, a heterogeneous surface pattern with areas of Ag and areas of Si can be used to cause the deposition to selectively occur on Si. This is attributed to the differential wetting of the VP monomer on the two dissimilar surface materials, as evidenced by the higher contact angle of VP on Ag compared to VP on Si.

Another important factor that has been found to affect selectivity is the relative rates of polymerization and condensation. A low reaction rate allows the monomer to move toward the higher energy surface. Otherwise, if the polymerization reaction is too fast, the polymer tends to deposit on all surfaces. The ability to utilize iCVD and its supersaturation mode as a means to direct polymer growth and achieve spatial polymer patterns enables solvent-free technology for the development of patterned architectures and designs for application in biomedicine, energy, electronics, and electromechanical systems.

Any suitable polymer may be used for patterning in the present invention. Preferably, the polymer has a relatively slow polymerization reaction rate as to prevent the polymerization from surpassing the wetting rate under iCVD supersaturated conditions. Preferably, the polymer is selected from poly(methyl methacrylate), poly(styrene), poly(vinylimidazole), and poly(vinylpyrrolidone). More preferably, the polymer is poly(vinylpyrroldione) (PVP).

PVP is a water soluble polymer produced conventionally by the thermally initiated free radical polymerization of the N-vinylpyrrolidone monomer. As shown in the examples, iCVD is used to deposit PVP under varying conditions such as reactor pressure and substrate temperature. The deposition kinetics were found to be dependent on the rate of monomer adsorption from the vapor phase to the substrate surface. Additional examples demonstrate the deposition kinetics of PVP deposited under supersaturated conditions of the monomer, and will be discussed in detail below.

Figure 2:
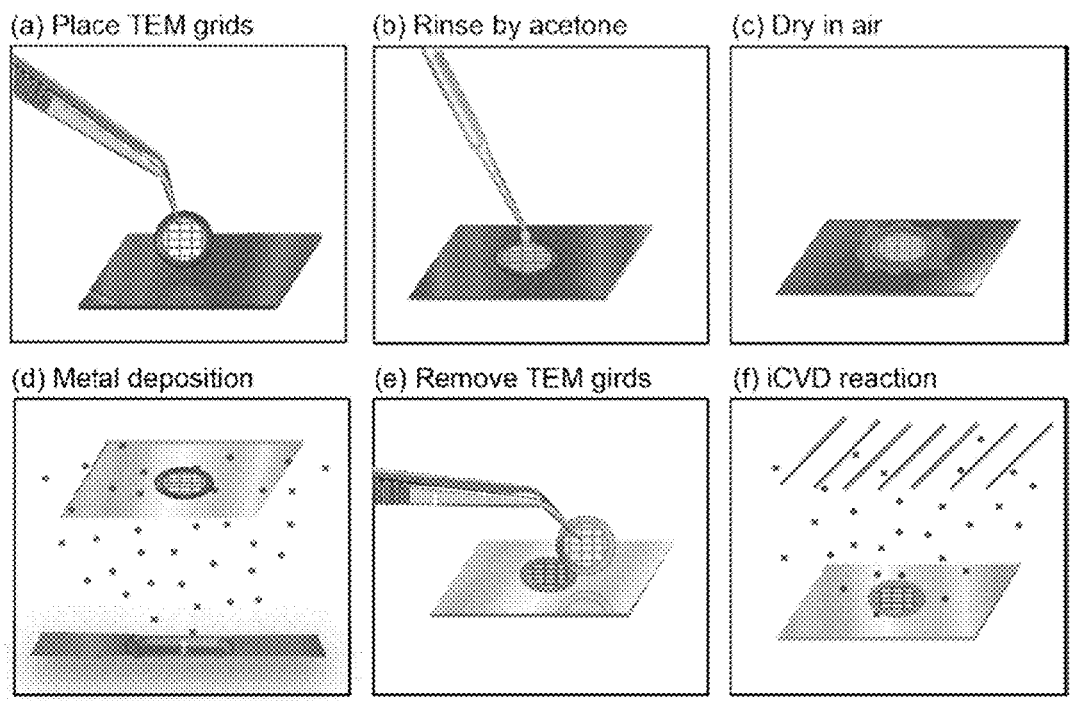
FIG. 2 shows a procedure for the preparation of heterogeneous surfaces and subsequent iCVD polymer growth.

FIG. 2 illustrates the procedure of making compositionally heterogeneous surfaces for use as a substrate in the patterning process. To create a heterogeneous pattern of two materials on a support surface, a first material was thermally evaporated on a surface to create a blanket film. Preferably, the support surface is a silicon wafer, or similar material and the first material is preferably a metal. More preferably, the first material is selected from titanium, chromium, silicon, nickel and platinum. Most preferably, the first material is silicon, which may be the substrate itself or may be in the form of a blanket film. The film or substrate of the first material provides a first surface having a first surface energy. The first surface has a thickness of preferably from about 1 nm to about 100 nm with a most preferred target thickness of about 20 nm. Alternatively, the substrate material itself, without a coating can be the first material.

Next, a TEM mask, with the more polished side preferably facing the substrate, was placed on the first surface. In a preferred embodiment, the mask contains nickel. A suitable solvent such as acetone may be used to wet the grid and by letting the solvent dry in air, the TEM mask adheres to the surface to provide the contact mask. Any other contact mask can be used to block out portions of the substrate that are not intended to be coated with the second material. Further, any other conventional method of masking or placement and securing of a masking material can be used for this purpose.

A second material is then thermally evaporated onto the masked first surface. The second material is selected from a material having a different surface energy than the first material, and is preferably a second metal. Most preferably, the second material is selected from silver, gold or tin. The second material creates a film on top of the first surface and the mask and creates a second surface. The second surface may have a thickness of about 1 nm to about 100 nm, and a most preferably a thickness of about 70 nm to about 100 nm.

The TEM patterns are then peeled off to create the dual-material patterns, where the first material is the area covered by the TEM pattern (blocked by the TEM mask from the second material deposition) and the second material is the area that was not covered by the TEM pattern.

The preferred process for each thermal evaporation step is as follows. However, any suitable known method of thermal evaporation can be used for this purpose. For each thermal evaporation, metal pellets are placed in a tungsten boat (B6, Electron Microscopy Sciences) and heated in a thermal evaporator (Thermionics VE 90). To deposit each material, the current is increased at increments of 20 A until a deposition rate of 1-5 Å/s is recorded by a quartz crystal monitor (Inficon). The final step involves placing the compositionally heterogeneous surface in the iCVD reactor where the iCVD reaction is performed, as discussed in detail below.

The first surface and the second surface, formed by the first material and the second material, respectively, have different surface energies. The second surface has a lower surface energy than the first material, or the substrate surface. Preferably, the surface energy of the first surface is greater than the surface energy of the second surface by at least a factor of 10%. More preferably, the surface energy of the first surface is greater than the surface energy of the second surface by a factor of about 10% to about 400%. Most preferably, the surface energy of the first surface is greater than the second surface by a factor of about 100%. The first surface energy is greater than about 1.5 J.m$^{-2}$. Preferably, the first surface energy is from about 1.7 to about 2.4 J.m$^{-2}$. The second surface energy is less than about 1.5 J.m$^{-2}$. Preferably, the second surface energy is from about 0.7 to about 1.3 J.m$^{-2}$.

For the deposition to be applied to the pattern as desired, the first surface is mostly wetting and the second surface is mostly non-wetting as determined for the polymer deposited during the iCVD process. Wetting is determined based on the contact angle between the deposited monomer and the surface. Preferably, the contact angle between the monomer and the first surface is lower than 10°, and the contact angle between the monomer and the second surface is higher than 10°.

The naming convention for the various compositionally heterogeneous surfaces is as follows "second metal/first metal" or "metal/silicon." In this naming convention, the left identifier refers to the pattern hole material and right identifier denotes the pattern line material. For example, Au/Ti refers to gold patterned onto a film of titanium supported on silicon, while Ag/Si refers to silver patterned directly onto the silicon substrate without a first metal evaporation step.

FIG. 1 shows the iCVD process. Monomer and initiator vapors flow into the reactor where a heated filament, located inside the chamber, activates the initiator. Next, both the activated initiator and monomer adsorb onto the surface of the substrate. The activated initiator then begins the polymerization process thereby linking monomer units together to form the polymer chain.

For the patterned deposition, the substrate discussed above is used in the iCVD process. The iCVD process is operated at conditions that result in a fractional saturation $P_m/P_{sat}$ of the monomer in the range of greater than 1 to about 2. Preferably, the fractional saturation $P_m/P_{sat}$ of the monomer is about 1.2 to about 1.6. The iCVD process is preferably carried out in vacuum reactor kept at a constant pressure between about 0.1 Torr and about 100 Torr and at a constant temperature in the range of about −15° C. to about 25° C.

The monomer and initiator are preferably introduced to the deposition step in the vacuum chamber as vapors at a flow rate between about 0.1 sccm and about 100 sccm. Preferably, the flow rate of vapor introduction is between about 0.1sccm and about 10 sccm. After the iCVD process is complete the resulting substrate has a patterned polymer layer formed on its surface.

It is to be understood, however, that even though numerous characteristics and advantages of the present invention have been set forth in the foregoing description, together with details of the method, composition and function of the invention, the disclosure is illustrative only, and changes may be made in detail, within the principles of the invention to the full extent indicated by the broad general meaning of the terms in which the appended claims are expressed.

The following examples are illustrative, but not limiting, of a method for patterning polymers and directing polymer growth using iCVD in accordance with the present disclosure. Other suitable modifications and adaptations of the variety of conditions and parameters normally encountered in the field, and which are obvious to those skilled in the art, are within the scope of the disclosure.

EXAMPLES

Example 1

Deposition Behavior of Poly(Vinylpyrrolidone)

The monomer 1-vinyl-2-pyrrolidone (VP; 99% Aldrich) and the initiator di-tert-butyl peroxide (TBPO; 98% Aldrich), as shown below, were used without further purification for the polymerization of PVP using iCVD.

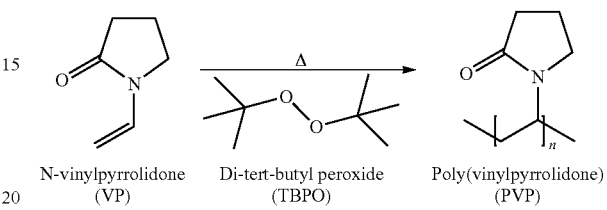

N-vinylpyrrolidone (VP)    Di-tert-butyl peroxide (TBPO)    Poly(vinylpyrrolidone) (PVP)

The polymer was deposited as a thin film on silicon substrates in a stainless steel custom-built vacuum reactor. The monomer, VP, was heated in a source container to 80° C. in order to attain sufficient vapor pressure, while initiator TBPO was kept at room temperature. Vapors of both VP and TBPO were provided to the reactor at flow rates of 1 and 0.2 sccm (standard cubic cm per min), respectively, using needle valves. The filament wire used for both reactions was Chromaloy O (Goodfellow). For PVP, the filament array was heated to 270° C. and the temperature was maintained constant for all runs by passing a current of 1.25 A through the filament, which produced a voltage of 20.7 V. A Sorensen DLM 60-10 DC power supply was used to power the filament.

Two series of films were prepared, one with varying reactor pressure and one with varying substrate temperature. For the PVP pressure series, the substrate temperature was kept constant at 33° C., and the pressure was varied between 13.3 and 33.3 Pa (0.1 and 0.25 Torr). For the PVP temperature series, the pressure was maintained constant at 20 Pa (0.15 Torr) and substrate temperature was varied between 30° C. and 43° C. Due to the temperature gradient resulting from the temperature difference between the heated filament and cooled stage, the actual temperature of the substrate was measured at each condition using a K-type thermocouple attached directly to the silicon wafer substrate. The reactor pressure was maintained at a specified set point using a pressure controller (MKS Instruments, 626A) connected to a downstream throttle valve (MKS Instruments, 156) located between the iCVD reactor and a dry vacuum pump (Edwards Vacuum, iH80). The substrate temperature was controlled by backside contact with a stage cooled or heated using a thermal fluid recirculating through a chiller/heater (Thermo Electron, Neslab RTE-7).

Polymer Characterization

In order to confirm the deposition of PVP, several characterization techniques were utilized. Fourier-transform infrared (FTIR) spectroscopy measurements were performed on a Thermo Nicolet 6700 spectrometer in normal transmission mode. After a 5 min purge of nitrogen gas to reduce atmospheric moisture and carbon dioxide in the sampling chamber, 32-64 scans were taken from 400-4000 cm$^{-1}$ using a Deuterated Tri Glycine Sulfate detector of a background spectrum of bare silicon. Once removed, each sample was placed in the spectrometer and allowed to purge again with nitrogen gas for 5 min, and scanned 32-64 times against the clean silicon background. The major spectral peaks were analyzed for chemical groupings specific to the monomer, N-vinylpyrrolidone, and polymer, PVP. All FTIR spectra were baseline corrected.

X-ray photoelectron spectroscopy (XPS) was done on a Physical Electronics VersaProbe 5000 with a scanning monochromatic source from an Al anode and with dual beam charge neutralization. High resolution XPS spectra of C1s were acquired in high power mode of 100 W over a binding energy range of 280 to 300 eV. The resulting spectra were compared to literature data in a polymer XPS database.

Gel permeation chromatography (GPC) was used to determine the molecular weight and polydispersity of PVP. An HPLC-grade tetrahydrofuran solvent (OmniSolv 99.9%) was used to make a polymer solution having a concentration of 1 mg/ml, which was then injected into the GPC column and analyzed using a refractive index detector. Molecular weight and distribution were determined based on a calibration curve of different poly(styrene) standards of known molecular weights.

The thickness of each PVP film was estimated using a M-2000U spectroscopic ellipsometer from J. A. Woollam with scans at 60°, 70°, and 80° angles. Raw amplitude and phase change data were fitted to a film model created in the WVASE32 software that consists of a bare silicon substrate, a 7 Å native oxide layer, and a Cauchy model layer to represent the PVP polymer film. By minimizing the mean squared error using WVASE32, the converged film model provided an estimate of film thickness and optical constants that best fit the sample data. Average deposition rate was then calculated by dividing the thickness of the film over the total measured reaction time.

PVP Structure and Composition

Figure 3:
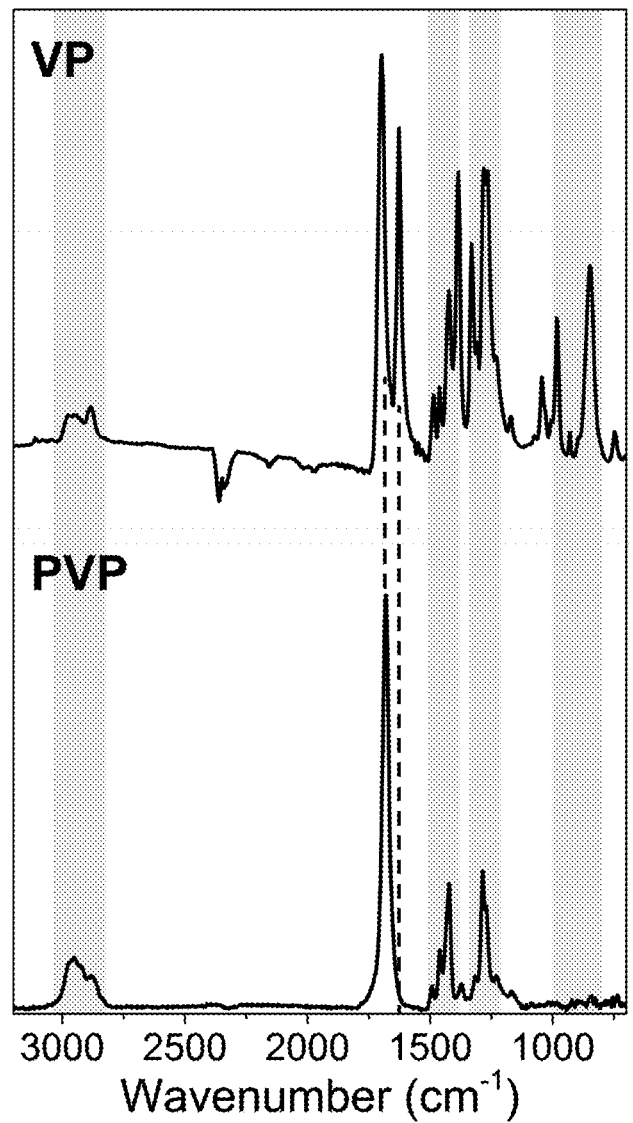
FIG. 3 shows an FTIR spectrum of VP monomer and PVP polymer.

FIG. 3 compares the FTIR spectra of a PVP film and the corresponding monomer VP. All PVP samples in the experimental pressure and substrate temperature series have identical FTIR spectra. For PVP, the broad peak around 2800-3000 $cm^{-1}$ represents $CH_x$ stretches and the peaks from 1400 to 1500 $cm^{-1}$ represent the C—C stretch. The C—N stretch is identified by the peaks from 1250 to 1335 $cm^{-1}$. The strong intensity peak at approximately 1680 $cm^{-1}$ represents the C=O stretch and is close to the previously reported value of 1682 $cm^{-1}$ determined using FTIR after iCVD synthesis. The absence of the peak at 1631 $cm^{-1}$ for PVP, indicating the vinyl bond in the monomer VP, signifies that polymerization has occurred through the anticipated C=C bonds. Further proof of polymerization is the absence of the peaks from 650 to 1000 $cm^{-1}$ for PVP, representing the =C—H bend of the monomer VP, again signifying that the C=C double bond is broken during free radical polymerization [25].

Figure 4:
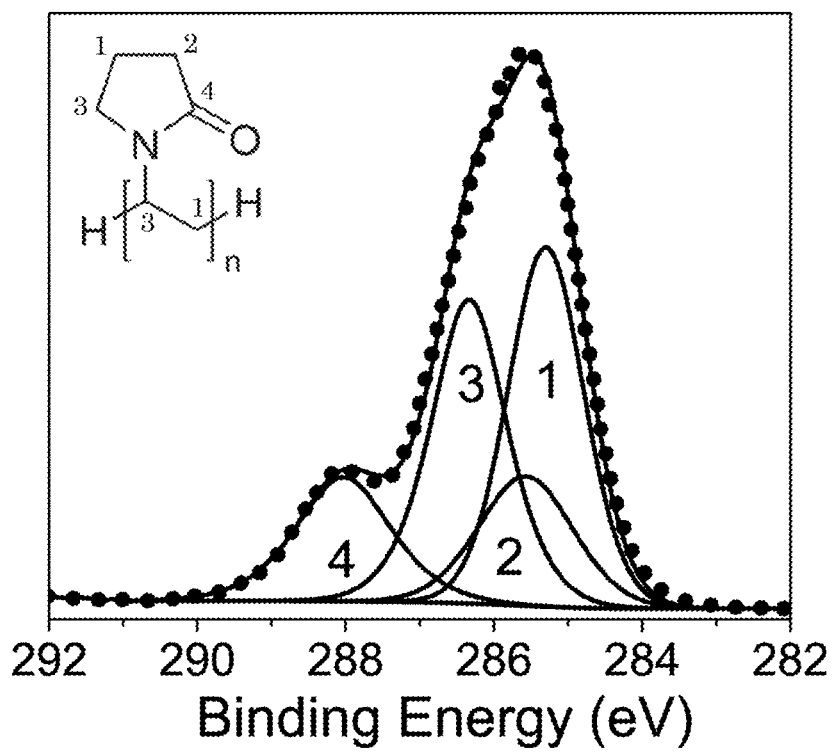
FIG. 4 shows a C1s XPS scan of PVP and the corresponding resolved C1s peaks.

XPS was also done to confirm the deposition of PVP. FIG. 4 shows a high resolution C1s scan of the polymer. The scan can be resolved into four separate carbon bonding environments that are matched to the chemical structure of PVP. Peaks 1-4 correspond to the carbons of the C—C—C, C—C—C=O, C—N and C=O bonds of PVP, respectively. Table 1 details the percent area under each resolved peak and the corresponding experimental peak intensity ratios relative to the C=O peak (peak 4). The experimental ratios can be compared to the theoretical ratios based on the expected polymer stoichiometry of PVP. The stoichiometric chemical structure of PVP leads to 2:1:2:1 ratios of peaks 1, 2, 3 and 4, respectively, while the experimental ratios are found to be 2.23:1.00:1.96:1.00, which are close to the theoretical values. The FTIR and XPS results therefore indicate iCVD polymerization of PVP.

Table 1 shows the resolved C1s peaks of PVP with their respective binding energy and percent area.

TABLE 1

| | Carbon | | | |
|---|---|---|---|---|
| | 1 | 2 | 3 | 4 |
| BE (eV) | 285.19 | 285.73 | 286.38 | 288.11 |
| % Area | 35.98 | 16.16 | 31.70 | 16.16 |
| Experimental Ratio | 2.23 | 1.00 | 1.96 | 1.00 |
| Theoretical Ratio | 2.00 | 1.00 | 2.00 | 1.00 |

Molecular Weight and Distribution

In addition to FTIR and XPS, GPC was carried out to determine representative molecular weight and polydispersity of both PVP. PVP deposited at a fractional monomer saturation $P_m/P_{sat}$ of 0.745 was found to have a number average molecular weight ($M_n$) of 18,165 a polydispersity index of 1.47. The high value of polydispersity for the iCVD PVP polymer is expected when employing thermally initiated free radical polymerization, which in general produces broad molecular weight distributions due to the continuous growth of polymer chains during monomer conversion as more polymer chains are initiated and created. These results are similar to results from previous iCVD work with the formation of high molecular weight polymers with broad dispersity and in which molecular weight is shown to increase with increasing $P_m/P_{sat}$.

Deposition Kinetics

Figure 5A:
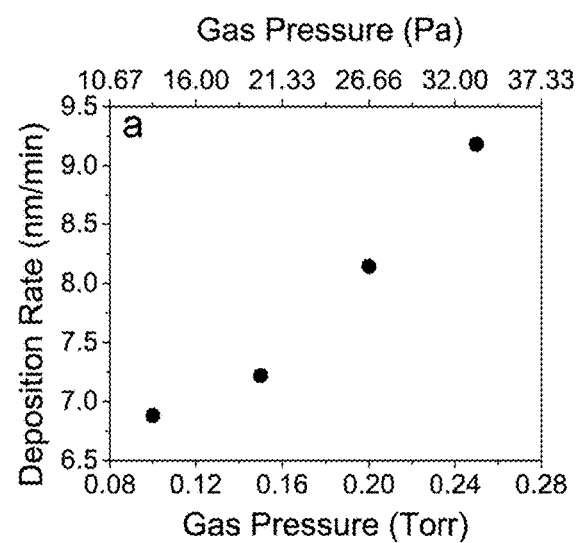
FIG. 5a is a graph of the deposition rate of PVP as a function of gas pressure.

The deposition rate of each polymer film was calculated by measuring the thickness from spectroscopic ellipsometry and dividing it by the total reaction time. FIG. 5a shows the deposition rate vs. gas pressure for PVP. The deposition rate increases linearly with increasing reactor pressure at constant substrate temperature. Increasing pressure increases the monomer concentration for the polymerization reaction. In regards to the effect of initiator on the deposition rate, the initiator is more volatile than the monomer, therefore surface adsorption of the initiator is expected to be significantly less than monomer adsorption. In addition, the initiator reacts directly from the gas phase with the adsorbed monomer at a faster rate than initiator adsorption on the surface. Previous studies have shown that iCVD kinetics are zero order with respect to initiator concentration. Therefore, the kinetics is not controlled by the initiator and in turn does not affect the deposition rate of the polymer.

Figure 5B:
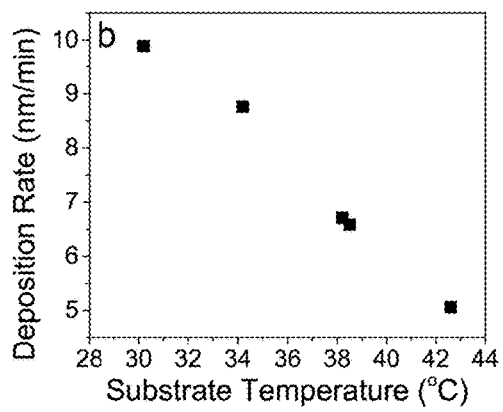
FIG. 5b is a graph of the deposition rate of PVP as a function of substrate temperature.

FIG. 5b shows the desposition rate of PVP as a function of substrate temperature at constant reactor pressure. The deposition rate decreases with increasing substrate temperature. This result is not intuitive in that normally the rate of reaction increases with increasing temperature for normal Arrhenius behavior. Instead, the observed trends indicate that PVP deposition is favored on a colder substrate and a faster rate of polymerization is realized at a lower temperature. This implies that the deposition rate is limited by the rate of adsorption of monomer on the substrate rather than the intrinsic polymerization rate. With more adsorbed monomer present on a colder surface, the increased surface concentration of monomer leads to a corresponding increase in reaction rate at the surface to create a thicker film.

Figure 5C:
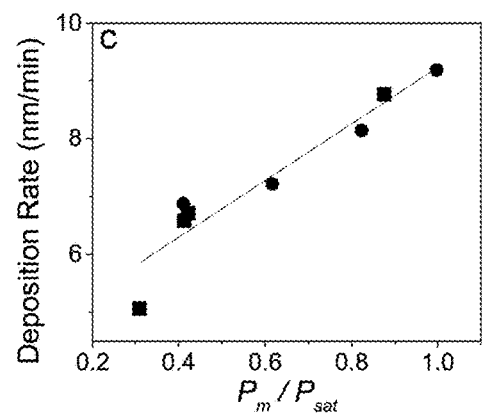
FIG. 5c is a graph of the deposition rate of PVP as a function of $P_m/P_{sat}$.

FIG. 5c shows the deposition rate of PVP as a function of the fractional saturation ratio of the monomer pressure to saturation pressure ($P_m/P_{sat}$). The $P_m/P_{sat}$ ratio essentially represents the surface concentration of monomer on the substrate surface and the collapse of rate data for a wide range of deposition conditions to a single linear relationship with $P_m/P_{sat}$ strongly indicates that this monomer adsorption parameter is key to controlling iCVD polymerization kinetics. For instance, a thin film is deposited faster at a $P_m/P_{sat}$ closer to 1, the saturation point, than at a lower $P_m/P_{sat}$. However, if $P_m/P_{sat}$ is greater than 1, the the monomer vapor will most likely condense on the substrate rather than polymerize. The linear increase in deposition rate with the surface monomer concentration suggests polymerization is first order with respect to the respective monomer, which agrees with a thermally initiated free radical polymerization mechanism.

Conclusion

In summary, PVP was deposited under various iCVD reactor conditions. The deposition rate for PVP was found to increase with increasing reactor pressure and decrease with increasing substrate temperature. The fractional saturation $P_m/P_{sat}$ was found to be the unifying parameter influencing deposition kinetics.

Example 2

Selective Deposition of Poly(Vinylpyrrolidone) Under Supersaturated Conditions

PVP was deposited using iCVD under supersaturated conditions on four different surfaces: titanium (Ti), silicon (Si), silver (Ag), and polytetrafluoroethylene (PTFE). The silicon substrates were purchased from WRS Materials and used as received. Each of the other materials were deposited on the silicon wafer. PTFE was deposited on the silicon substrate using iCVD, using a process known in the art. Hexafluoropropylene oxide (HFPO) vapor, which is the reactive precursor to forming PTFE, were provided to the reactor at a flow rate of 10 sccm. The pressure and substrate temperature were kept constant at 0.15 Torr and 30° C., respectively. The filament wire, phosphor bronze (Central Wire Industries), was heated to 500° C. (filament current of 5 A). Titanium and silver were deposited on the silicon substrate using a Thermionics VE 90 thermal evaporator. The ⅛" metal source pellets and tungsten boats needed for evaporation were purchased from Kurt J Lesker. To deposit each metal, the current was increased at increments of 20 A until a deposition rate of 1-5 nm/min was achieved. Ti and Ag started depositing at 180 A and 160 A, respectively. Once the desired thickness was reached, the current was immediately shut off and the instrument was left to pump down for 15 minutes before opening the chamber.

Contact Angle Measurements

In order to determine the contact angles of the monomer, VP, and deionized water on Ti, Si, Ag and PTFE, a high resolution, custom-built contact angle goniometer was utilized. The contact angle was calculated from the images using the Low-Bond Axisymmetric Drop Shape Analysis for Surface Tension and Contact Angle Measurements (LB-ADSA) plug-in of Image J. The LB-ADSA is based on fitting the Young-Laplace equation to the image data. The height, width and diameter of the drop are adjusted manually until the model fits the droplet image. The contact angle is constantly calculated by applying an image-energy term that, based on the inputted boundary conditions, generates an approximation of the Young-Laplace equation.

iCVD of PVP Under Supersaturated Conditions

The monomer 1-vinyl-2-pyrrolidone (VP; 99% Aldrich) and the initiator di-tert-butyl peroxide (TBPO; 98% Aldrich) were used without further purification for the polymerization of PVP using iCVD on Ti, Si, Ag, and PTFE. The reactions were carried out in a custom-built vacuum reactor. In order to attain sufficient vapor pressure, the monomer, VP, was heated in a source container to 90° C., while the initiator, TBPO, was kept at room temperature. Vapors of both VP and TBPO were provided to the reactor at flow rates of 0.5 and 0.1 sccm (standard cubic cm per min), respectively, using precision needle valves. The filament wire, Chromaloy O (Goodfellow), was heated to 270° C. using a Sorensen DLM 60-10 DC power supply set at a filament current of 1.25 A. The pressure and substrate temperature were kept constant at 0.15 Torr and 22° C., respectively. At these conditions, the fractional saturation $P_m/P_{sat}$ of the monomer was 1.44. Details of the iCVD reactor system are described above in Example 1.

Thin Film Characterization

The thickness of each film was estimated using a M-2000U spectroscopic ellipsometer from J. A. Woollam with scans at 60°, 70°, and 80° angles. For PVP deposited on Si, raw amplitude and phase change data were fitted to a film model created in the WVASE32 software that consists of a bare silicon substrate, a 7 Å native oxide layer, and a Cauchy model layer to represent the PVP. For PVP deposited on a PTFE film on Si, a multilayer film model was created consisting of a bare silicon substrate, a 7 Å native oxide layer and two Cauchy model layers to represent PTFE and PVP, respectively. After determining the thickness of PTFE using the single Cauchy model for a PTFE-coated sample without PVP, the thickness of the PTFE layer was set and a second Cauchy model was added to model the PVP layer on a PTFE-coated sample containing a top layer of PVP. A similar procedure was performed to model PVP on Ti and Ag. First, a Ti or Ag coated silicon wafer without PVP was used to measure the thickness of the metal layer. Separate models specific to Ti and Ag available in the software were used to represent the respective metals. Once the thickness of each metal was determined and set, the Cauchy layer was added to calculate the thickness of PVP on both Ti and Ag.

Fourier-transform infrared (FTIR) and X-ray photoelectron spectroscopy (XPS) were used to confirm the polymerization of PVP on the different substrate surfaces. FTIR was used to characterize both the Ti and the substrate using a Thermo Nicolet 6700 spectrometer in normal transmission mode. A similar procedure as described in Example 1 was performed but with 128 scans from 400-4000 $cm^{-1}$. The spectra were analyzed for chemical groupings specific to PVP and Ti. All FTIR spectra were baseline corrected. XPS was used to characterize PVP deposition on Ag and Si surfaces using a Physical Electronics VersaProbe 5000. Survey and high resolution spectra were acquired to determine the presence of PVP on the surface. A monochromatic Al-Kα X-ray source (1486.6 eV) at 1.5 W with a beam diameter of 18 μm was used. The range of binding energies for each element, Ag3d, N1s, O1s, and C1s was 362-382 eV, 391-411 eV, 523-543 eV, and 278-298 eV, respectively. The step size for the high resolution and survey spectra was set at 0.05 and 0.02 eV, respectively. The pass energy was 23.5 eV and 117.4 eV for the high resolution and survey spectra.

Results and Discussion

Effect of Wettability on Deposition Rate

Figure 6:
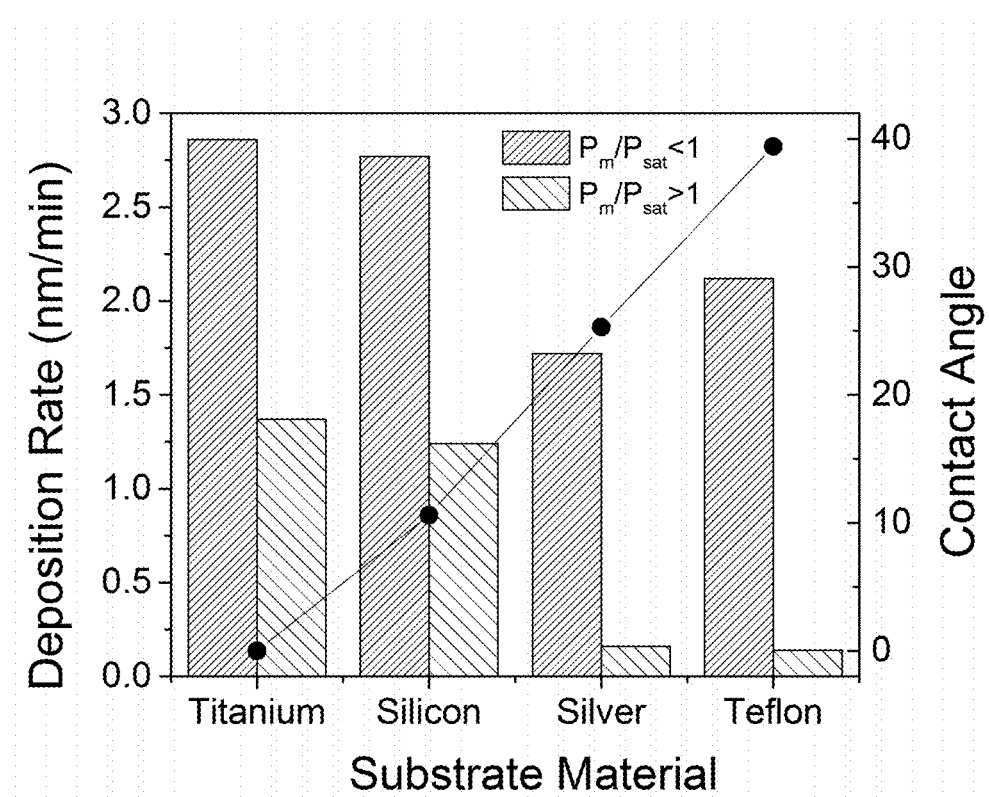
FIG. 6 is a plot of PVP deposition rate at normal and supersaturated conditions and corresponding VP contact angle for different substrate surfaces.

FIG. 6 plots the deposition rate of PVP on each substrate at supersaturated conditions, $P_m/P_{sat}$=1.44, and normal conditions, $P_m/P_{sat}$=0.77, and the contact angle of monomer, VP, on each corresponding surface material. Overall, the deposition rate decreases under supersaturated conditions for all contact angles compared to deposition at normal iCVD conditions. In addition, as the contact angle increases the deposition rate under supersaturated conditions decreases to the point where Ag and PTFE have an almost negligible deposition rate of below 0.3 nm/min. The deposition rate for substrates with a higher contact angle are also slower at both normal and supersaturated conditions.

Figure 7A:
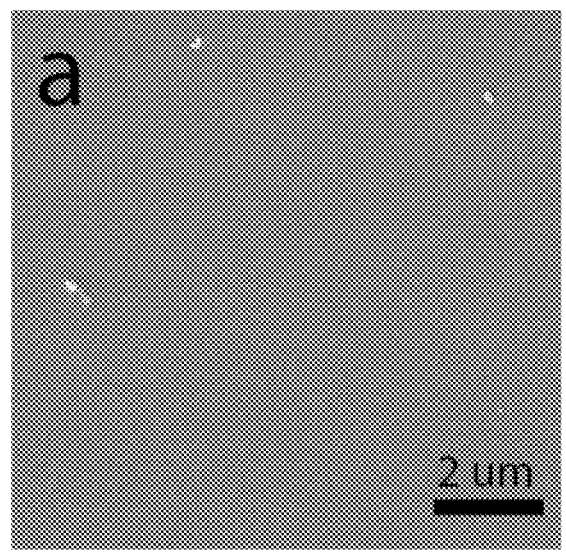
FIG. 7a is a top-down SEM image of PVP deposition on silicon under supersaturated conditions.
Figure 7B:
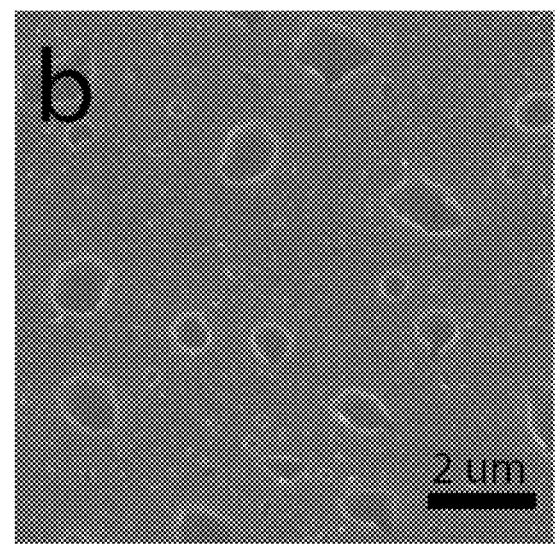
FIG. 7b is a top-down SEM image of PVP deposition on silver under supersaturated conditions.
Figure 8:
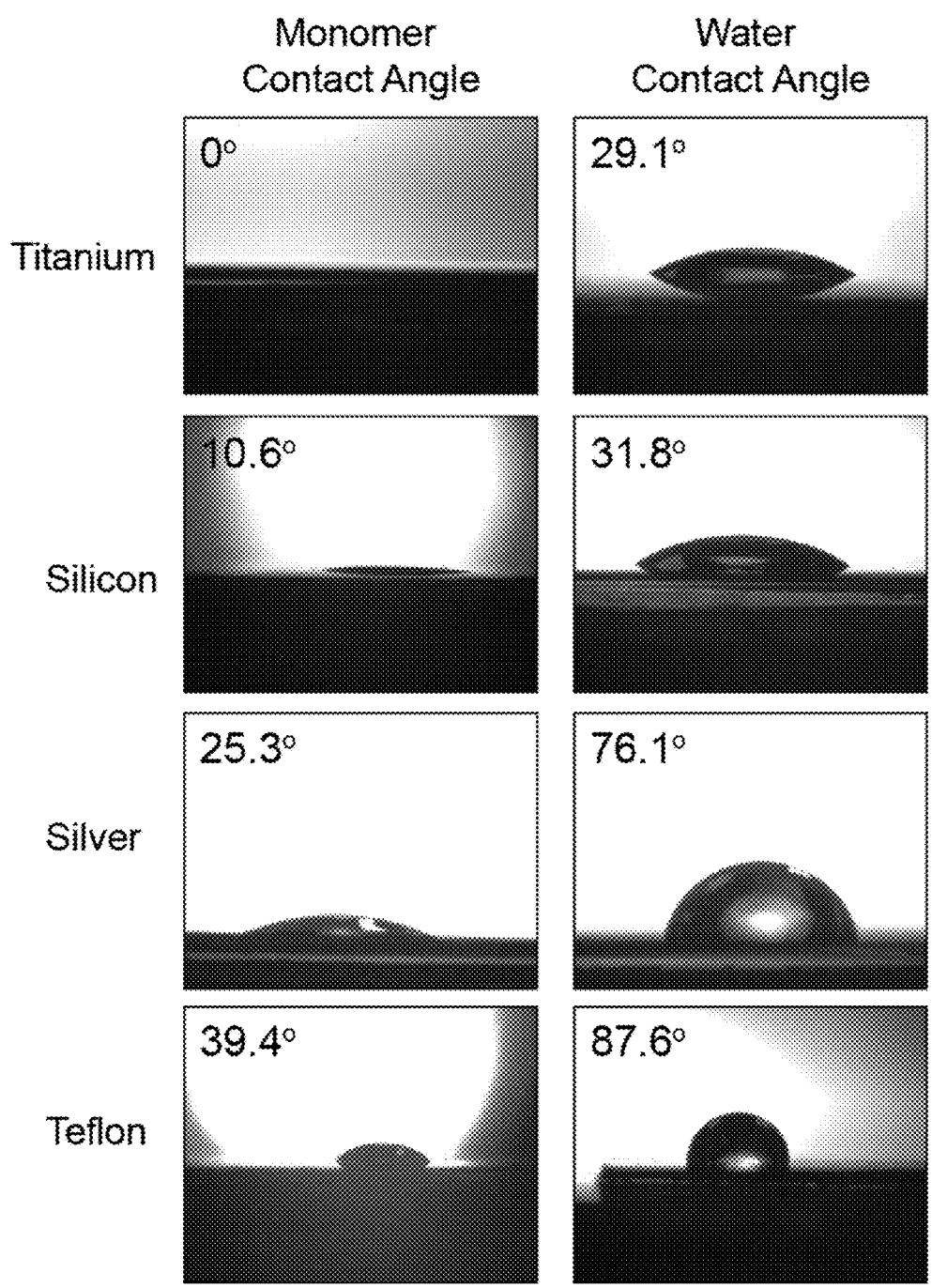
FIG. 8 shows the contact angle of monomer and water on Ti, Si, Ag and PTFE.

SEM was done to determine PVP morphology on the substrates. FIG. 7a shows the deposition of smooth, near-featureless PVP thin films on a Si surface at supersaturated conditions. FIG. 7b shows the formation of PVP islands rather than a continuous thin film on an Ag surface at supersaturated conditions. In order to understand these differences in deposition behavior and morphology, the wettability of the different surfaces was evaluated. FIG. 8 compares the contact angle of the monomer, VP, and water on each of the substrates (Ti, Si, Ag, PTFE). Titanium has the smallest contact angle for both monomer and water at 0° and 29.1°, respectively. Teflon (PTFE) has the largest contact angle for both monomer and water at 39.4° and 87.6°, respectively. Both monomer and water contact angles show the same trend in that the contact angle increases from Ti to Si to Ag to PTFE. Therefore, titanium is the most hydrophilic surface and PTFE is the most hydrophobic surface.

The reason PVP can deposit on silicon as a thin film is because silicon is a wettable substrate with a relatively low contact angle. The monomer is able to spread out across the substrate to form a thin film. This result is similar to previously reported results where PGMA was deposited under supersaturated conditions as a continuous thin film on a surface consisting of a crosslinked ethylene glycol diacrylate (EGDA) polymer. The contact angle of glycidyl methacrylate on polymerized EGDA was measured to be 25.1° and smooth PGMA films were produced. This can be contrasted with PGMA island growth on PTFE given the higher contact angle of 52° of the monomer. Wetting on silver is much less favorable and as a result a continuous film of PVP is much more difficult to form.

Characterization of PVP on Ag and Si Surfaces

Figure 9A:
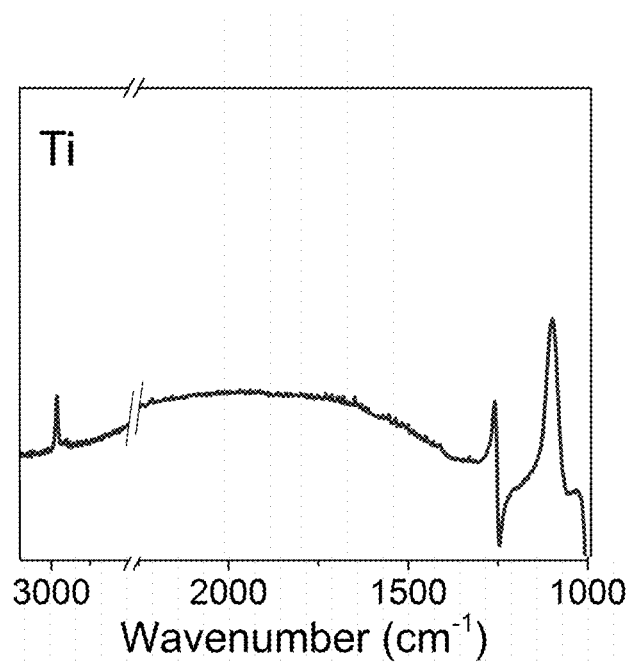
FIG. 9a is a spectra of Ti film.
Figure 9B:
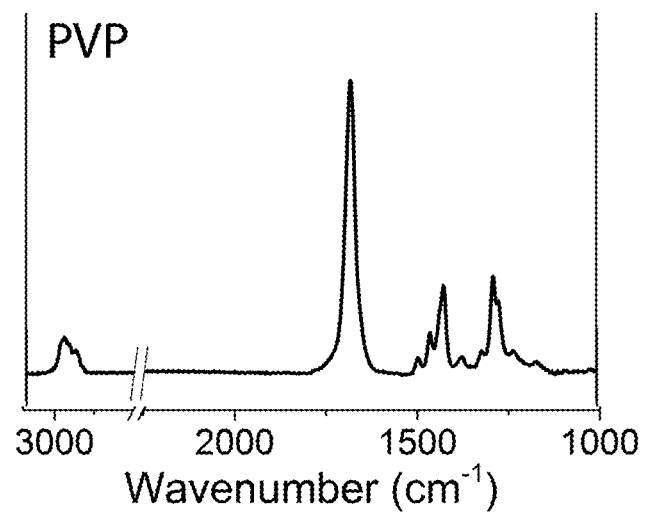
FIG. 9b is a spectra of PVP film.
Figure 9C:
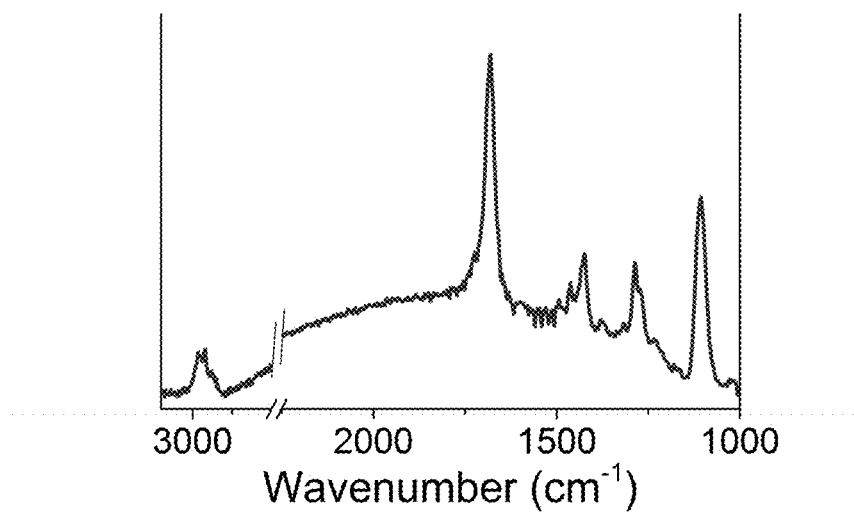
FIG. 9c is a spectra of PVP.

FIGS. 9a-9c compares the FTIR spectra of PVP deposited on titanium under supersaturation with the corresponding titanium and PVP films by themselves. For PVP, the broad peak around 2800-3000 $cm^{-1}$ represents CHx stretches, the peaks from 1400 to 1500 $cm^{-1}$ represent the C—C stretch and the peaks from 1250 to 1335 $cm^{-1}$ represent the C—N stretch. The C=O stretch is the strong peak at approximately 1680 $cm^{-1}$. For titanium the distinguishing peak is at 1100 $cm^{-1}$. The PVP film on Ti includes identical peaks associated separately with PVP and Ti, which indicates that PVP polymerization did occur on titanium under supersaturated conditions.

Figure 10A:
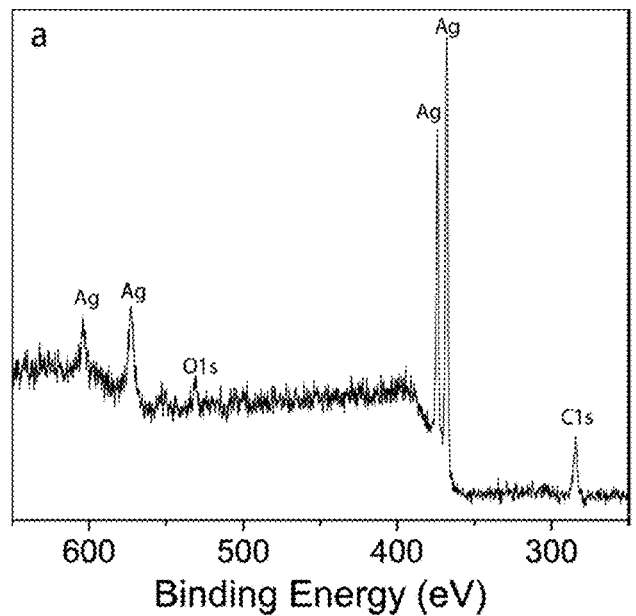
FIG. 10a shows XPS survey spectra of PVP deposited at $P_m/P_{sat}>1$ on Ag.
Figure 10B:
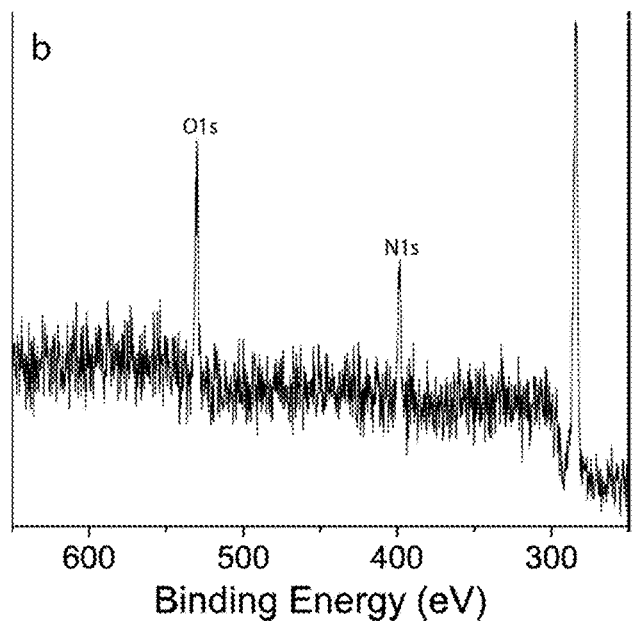
FIG. 10b shows XPS survey spectra of PVP deposited at $P_m/P_{sat}>1$ on Si.

FIGS. 10a and 10b show the survey spectra for PVP deposited at supersaturated conditions on Ag and Si, respectively. On the Ag surface, the absence of a nitrogen peak suggests the lack of PVP deposited on the Ag. However, the small oxygen and carbon peaks indicate that there could be PVP present. Since XPS is a surface technique that only penetrates up to 10 nm in depth of any surface, the strong Ag signal means that any PVP residing on the surface would have to be extremely thin. This is confirmed by ellipsometry, which estimates an average thickness of about 6±4.3 nm. The deposition of PVP on silicon under supersaturated conditions is confirmed by the presence of strong intensity peaks for carbon, oxygen, and nitrogen as seen in FIG. 10b. The lack of any Si peak indicates a sufficiently thick PVP film, which ellipsometry estimates as 103±2.6 nm.

Conclusion

The formation of smooth PVP films under supersaturated conditions was achieved using iCVD on Si and Ti. In contrast, near-zero deposition was found for the Ag and PTFE surfaces. The differences in deposition behavior can be related to the wettability of the surfaces by the monomer as there is a correlation between the contact angle of the monomer, VP, with the deposition rate.

Example 3

Patterned Polymers and Directed Polymer Growth of PVP by iCVD

Selective Deposition of PVP on Si with Ag Patterns

Figure 11:
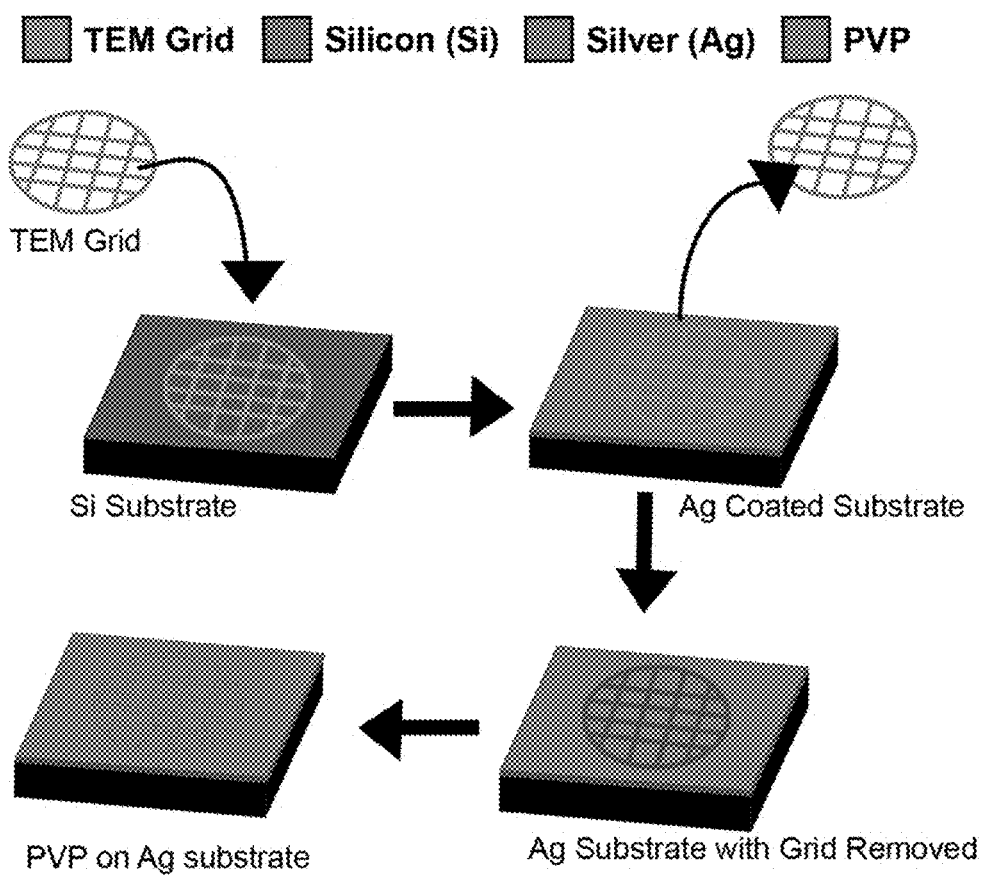
FIG. 11 shows a schematic representation of a patterning process according to one embodiment.

Under supersaturated conditions, PVP deposition on Ag was found to be fairly minimal compared to that on Si. Therefore, the ability to selectively deposit PVP using patterns of Ag on Si was explored. Athene 200 mesh TEM grids (G216) with an open central square were purchased from TedPella for creating the Ag patterns on Si. The grids are made of copper and are 3.05 mm in diameter with a hole width of 100 μm, a grid pitch of 125 μm and a line width of 35 μm. A schematic of the patterning process is shown in FIG. 11. Prior to Ag deposition, the TEM grid was first dipped in acetone (BDH Chemicals), placed on the silicon wafer and held down with a smaller piece of silicon for 20 s. The top silicon piece was then removed to allow acetone to evaporate. Any remaining residue was wiped off the silicon wafer using a cotton swab soaked in acetone. Once the grid was in place, Ag was deposited using the thermal evaporation method described in above. After depositing Ag, the grids were removed and placed in the iCVD chamber to deposit PVP using the iCVD process described above.

FIG. 11 shows a schematic of the patterning process. Step 1 immerses the TEM grid in acetone and places the grid on the silicon substrate, Step 2 deposits Ag on the silicon substrate, and Step 3 removes the TEM grid.

Characterization of Patterned Films

XPS elemental mapping was used to determine the spatial location of key elements in the patterned films. XPS was done with the smallest beam size of 10 μm to maximize spatial resolution. The X-ray source used was an Al 1486.6 eV mono at 1.5 W. For the Ag patterns, Ag3d, N1s and C1s were chosen as elements to be mapped. The range of binding energies for each element, Ag3d, N1s and C1s was 365-368 eV, 396-399 eV and 382-385 eV, respectively. The step size and pass energy for all three elements was set at 0.2 eV and 23.5 eV, respectively. The X-ray scanner was set at 256×256 pixels. The area of the image was 750×750 μm. Each element detection was repeated once with one cycle due to the large acquisition time involved with mapping. The results produce an image indicating the location of the elements of interest in the pattern.

Patterning of PVP on Ag and Si Surfaces

Figure 12A:
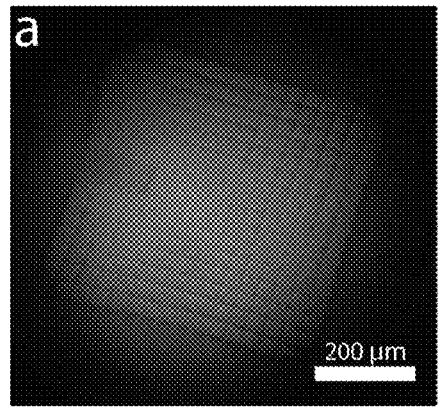
FIG. 12a is an SEM image of an entire TEM grid.
Figure 12B:
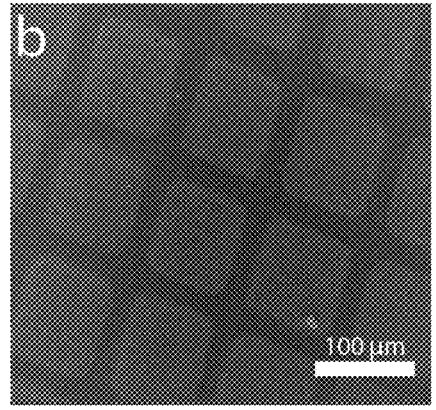
Figure 12C:
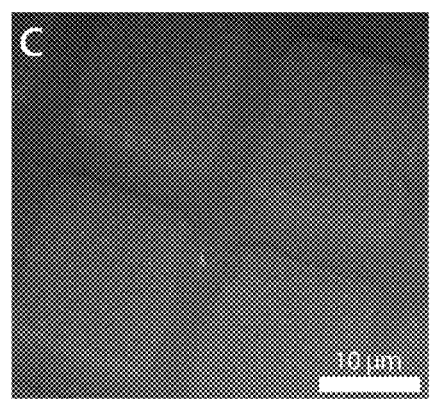
Figure 12D:
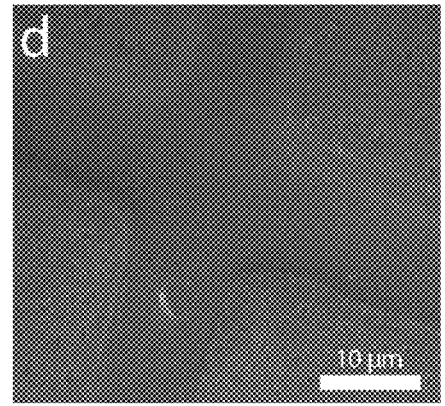

The drastic difference in PVP deposition affinities on Ag and Si makes it possible to selectively deposit PVP thin films on Si substrates containing Ag patterns. FIGS. 12a-12d shows SEM images of the selective PVP deposition on an Ag pattern created by the thermal evaporation of Ag onto a contact mask using a TEM grid. FIG. 12a shows a complete grid pattern on an Ag substrate at a magnification of 22×. FIG. 12b is the same pattern at a magnification of 150×. Examination of the image shows a good match with the TEM grid dimensions: the squares are 100 μm across, the line width is 34.7 μm, the pitch size is 124.8 μm and the diameter of the whole pattern is 3.05 mm. The materials contrast can also been seen in FIG. 12b in that the squares are lighter in color than the grid lines. The material inside the squares is Ag and the grid lines are coated with PVP. FIGS. 12c and 12d are images of the same pattern at even higher magnifications of 400× and 900×, respectively. Both images clearly show thicker grid lines corresponding to the uniform, thin film deposition of PVP on Si with no Ag. In contrast, in the grid holes in which Ag was deposited, there is essentially no PVP thin film deposition but rather a few scattered islands most likely of some random condensation of monomer that formed into polymer. These results reconfirm the selective deposition of PVP on Si vs. Ag surfaces that lead to patterned PVP grid lines that match the TEM grid lines which were used to mask Si from Ag deposition during thermal evaporation.

Figure 13A:
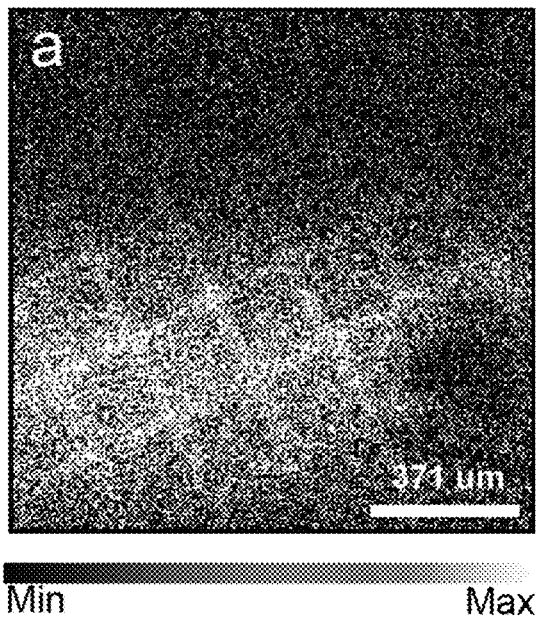
FIG. 13a shows XPS mapping on a patterned Ag surface detecting C1s of PVP in the grid lines.
Figure 13B:
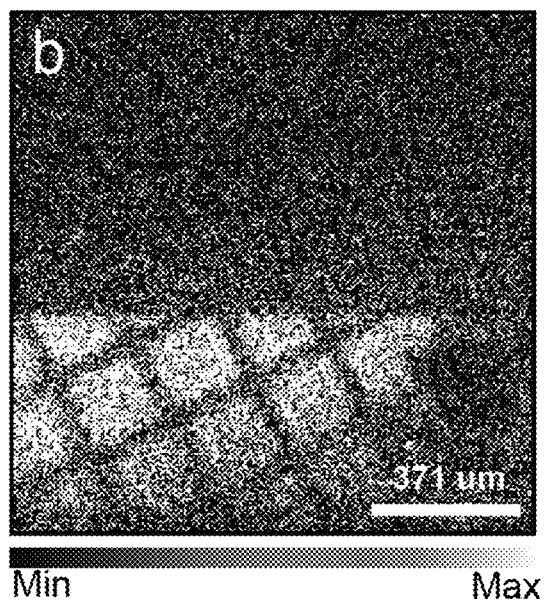
FIG. 13b shows XPS mapping on a patterned Ag surface detecting Ag3d of Ag in the grid holes.

In order to demonstrate more quantitatively that there is preferential deposition of PVP on Si rather than Ag, XPS elemental mapping was performed. FIG. 13a is an image of the pattern of Cls. The lighter regions indicate a higher concentrations of Cls. It is clear that carbon is more highly concentrated on the outside grid lines than in the squares. The presence of Cls, an identifying element for PVP, in larger quantities on the grid lines indicates PVP resides on the grid lines rather than in the squares. FIG. 13b is an image of the pattern corresponding to Ag3d. The lighter areas, with higher concentrations of Ag, are focused on the square regions. XPS mapping shows a clear separation of PVP and Ag in the pattern that agrees with the observations made by SEM.

Conclusion

The preferential deposition of PVP on Si instead of Ag enabled spatially selective deposition on Si for Ag patterns on Si. Results from SEM and XPS confirmed the ability to pattern PVP under supersaturated conditions.

After analyzing the deposition kinetics under normal iCVD conditions, results fostered an interest in studying PVP polymerization under supersaturated conditions. Literature studies indicate that films deposited under supersaturated conditions are generally not conformal or uniform due to monomer condensation and droplet coalescence, significantly influencing film formation. However, it has been shown here that PVP deposited on silicon produced smooth, uniform films. This was attributed to the lower contact angle of the monomer on this substrate, which indicates good wettability. Because the monomer spreads out more on surfaces with lower contact angles, thin film formation can be achieved. However, it was observed that as the monomer contact angle on the surface increases the deposition rate under supersaturation decreases due to the lower wettability. With the higher monomer contact angle, PVP deposition on a silver surface was minimal. This provided a suitable platform for enabling selective deposition of PVP on Si for a silicon substrate patterned with Ag using TEM grids as contact masks. SEM and XPS mapping confirmed the preferential deposition of PVP mainly on the regions of exposed silicon while the substrate covered with silver prevented any appreciable polymer deposition. The ability to create spatial patterns of PVP using iCVD could have many potential applications, including uses in tissue engineering and cell growth.

Under supersaturation conditions, the deposition rate of iCVD PVP decreased significantly, to the point where for some surfaces, like silver, the deposition became almost negligible (see FIG. 6). With the ability to suppress deposition on silver without suppressing deposition on silicon, a heterogeneous surface pattern with areas of Ag and areas of Si can be used to cause deposition to selectively occur on Si. PVP and polymers can be deposited on substrates with larger contact angles than Ag, such as PTFE.

Example 4

Figure 14:
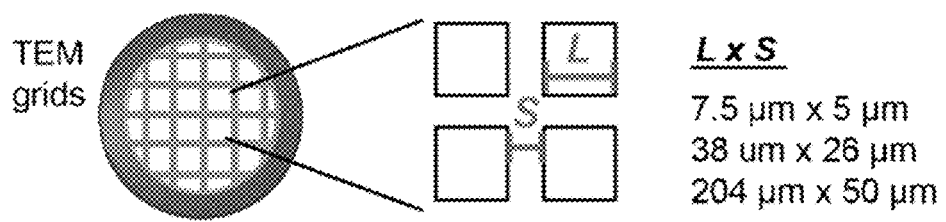
FIG. 14 shows an illustration of a TEM grid showing measurement locations for L×S dimensions.

Directed Polymer Growth of PVP on Various Different Materials iCVD was performed in the iCVD reactor system described in in Example 1. For PVP deposition, the VP monomer and TBPO initiator source jars were maintained at 80° C. and 30° C., respectively, to achieve sufficient vapor flow. The optimum flow rates of VP and TBPO were 1 and 0.2 sccm (standard cm$^3$ per min), respectively. The filament temperature was kept at 270° C. by resistively heating a filament array using a DC power supply (1.25 A/20.8 V), and reactor pressure was automatically controlled to 150 mtorr. The substrate surface temperature was varied through back-side contact with a thermal fluid recirculating through a Neslab heater/chiller to adjust $P_m/P_{sat}$ in order to study different supersaturation conditions (as shown in Table 2). The measurements for the size of pattern for L×S are shown in FIG. 14.

TABLE 2

| | PVP Conditions | | | | | | |
|---|---|---|---|---|---|---|---|
| Parameters | $F_m$ [sccm] | $F_i$ [sccm] | $P_t$ [torr] | $T_{fit}$ [° C.] | $T_{sub}$ [° C.] | $P_m/P_{sat}$ | Size of pattern L × S |
| Value | 1 | 0.2 | 0.15 | 270 | 23.5 | 1.28 | 7.5 μm × 5 μm |
| | | | | | 22.1 | 1.43 | 38 μm × 26 μm |
| | | | | | 21.3 | 1.53 | 204 μm × 50 μm |

Surface Topological Analysis

Scanning electron microscopy (SEM) was performed on a Zeiss Supra 50VP. Samples were inspected without adding the conductive Pd/Pt sputter coating. Top-down SEM images were taken at a low voltage of 2 kV to avoid damage to the polymer matrix and with a working distance of 2-3 mm. X-ray photoelectron spectroscopy (XPS) was performed on a Physical Electronics PHI 5000 VersaProbe with a monochromatic Al-Kα excitation source (1486 eV) and charge compensation. XPS elemental mapping was carried out with a pass energy of 58.7 eV and a power of 1.25 W was used for probing Ag (363.0-370.5 eV) and C (281.0-288.5 eV) while a power of 4.6 W was used for probing N (394.5-402 eV). A dwell time of 200 ms was used for each Ag and C mapping and a dwell time of 400 ms was used for N mapping. Atomic force microscopy (AFM) images were recorded with a Bruker NanoScope Multimode MM8 instrument under ambient conditions. The antimony-doped Si probes with a tip radius of 10 nm and spring constant of 42 N/m were purchased from Bruker (NCHV-A). Under tapping mode, images of 50×50 and 100×100 μm$^2$ were acquired at a scanning rate of about 1 Hz per line for a total of 256 lines.

Results and Discussion

Figure 15A:
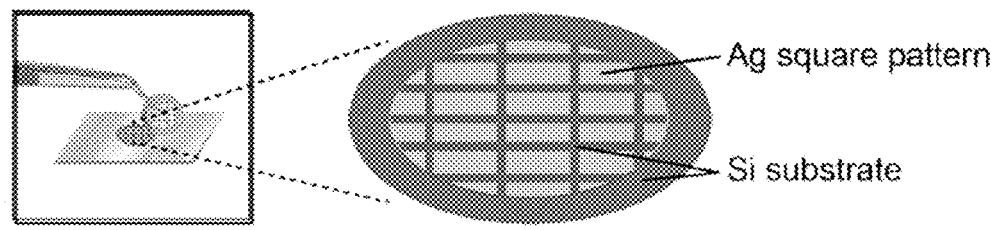
FIG. 15a shows an illustration of an Ag/Si pattern expected after thermal evaporation of Ag against a TEM contact mask on Si.
Figures 15B, 15C, 15D:
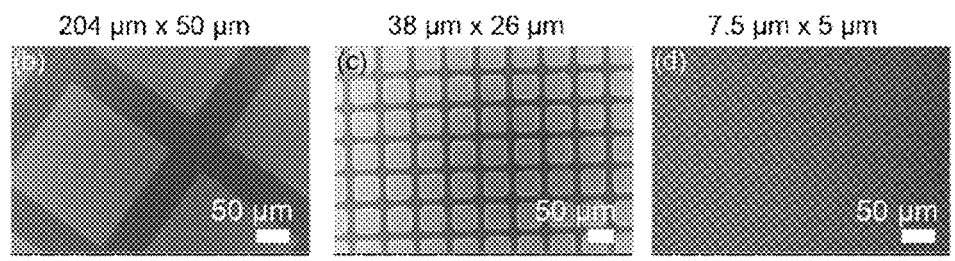
FIG. 15b is an SEM image taken under 250× magnification for pristine Ag/Si samples (without iCVD polymer) with L×S dimensions of 204×50 μm.
FIG. 15c is an SEM image taken under 250× magnification for pristine Ag/Si samples (without iCVD polymer) with L×S dimensions of 38×26 μm.
FIG. 15d is an SEM image taken under 250× magnification for pristine Ag/Si samples (without iCVD polymer) with L x S dimensions of 7.5×5 μm.
Figures 15E, 15F, 15G:
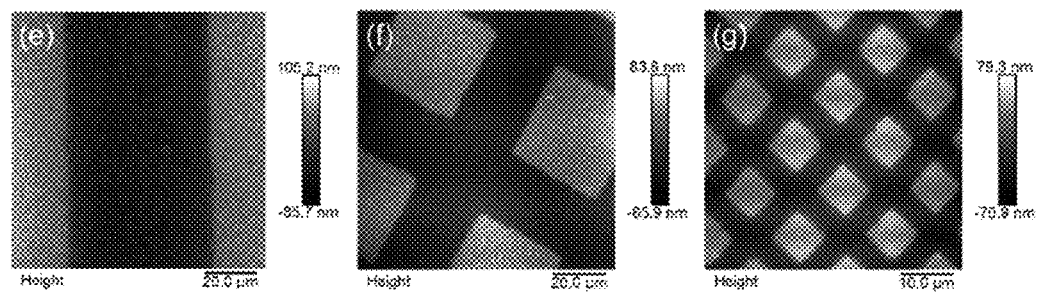
FIG. 15e is an AFM 2D height distribution corresponding to the SEM image of FIG. 15b.
FIG. 15f is an AFM 2D height distribution corresponding to the SEM image of FIG. 15c.
FIG. 15g is an AFM 2D height distribution corresponding to the SEM image of FIG. 15d.
Figures 15H, 15I, 15J:
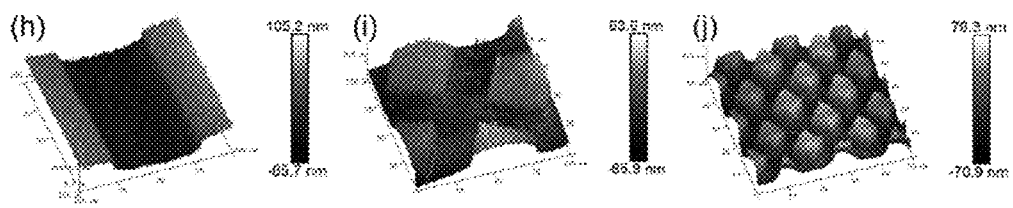
FIG. 15h is an AFM 3D height distribution corresponding to the SEM image of FIG. 15b.
FIG. 15i is an AFM 3D height distribution corresponding to the SEM image of FIG. 15c.
FIG. 15j is an AFM 3D height distribution corresponding to the SEM image of FIG. 15d.

The topography of pristine Ag/Si patterns (without iCVD polymer) at L×S dimensions of 7.5×5 μm, 38×26 μm and 204×50 μm made using the TEM contact masks were imaged by SEM and AFM, as seen in FIGS. 15a-15j. FIG. 15a illustrates the expected compositional surface pattern after Ag metal evaporation. The SEM images of FIGS.

15b-15d show that clear and well-defined Ag squares were formed on the Si surface as a result of thermal evaporation against the TEM contact mask. AFM images in FIGS. 15e-15j further confirm the SEM results, showing high fidelity of patterns of all sizes studied. AFM height estimates indicate that the Ag squares are 80 nm high. These results demonstrate that the TEM contact mask and thermal evaporation procedure is a viable approach for creating well-defined heterogeneous surfaces.

Figure 16A:
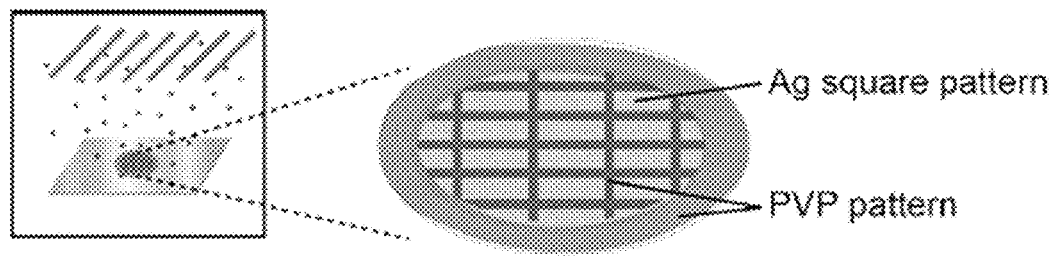
FIG. 16a shows an illustration of an anticipated PVP pattern on an Ag/Si surface.

After iCVD was performed on the pristine Ag/Si samples under supersaturated conditions at $P_m/P_{sat}$=1.43, the PVP coated samples were also analyzed by SEM and AFM and these images are displayed in FIGS. 16a-16p. FIG. 16a shows the anticipated selective deposition of PVP on Si and not Ag. SEM images in FIGS. 16a-16d qualitatively show that the respective patterns are preserved after iCVD PVP deposition. Further topographical analysis by AFM clearly shows that PVP is indeed deposited on the Si region, which corresponds to the pattern grid lines. The AFM topdown images shown in FIGS. 16e-16g and the 3D projections shown in FIGS. 16n-16p, reveal that the grid line regions are generally not lower in height than the Ag regions, indicating there is some deposition occurring in those regions. Particularly, for the 38×26 μm size, the grid line regions are much higher than the surrounding Ag squares, strongly indicating that PVP has selectively grown in these regions. Line traces across the grid lines as shown in FIGS. 16h-16j, reveal this growth quite clearly, again with the 38×26 μm size showing significant polymer growth of 230 nm in height. With the larger grid of 204×50 μm, the much larger Si surface region causes polymer growth of the same amount of polymer to be spread out over a larger area, yielding smaller polymer growth heights. At the other extreme, with the smallest grid of 7.5×5 μm, there appear to be undulations along the grid lines that are seen particularly in the 3D projection as well as in the line trace along the grid line. In contrast, line traces for the other two grid sizes do not show such significant undulations, see FIGS. 16k-16m. The undulations indicate that for the smallest grid, more polymer grows at the intersecting points where grid lines meet and less along the grid line area located between two adjacent squares. Presumably, there is more accessible Si area at the intersections that allow more favorable wetting and polymerization.

Figure 17:
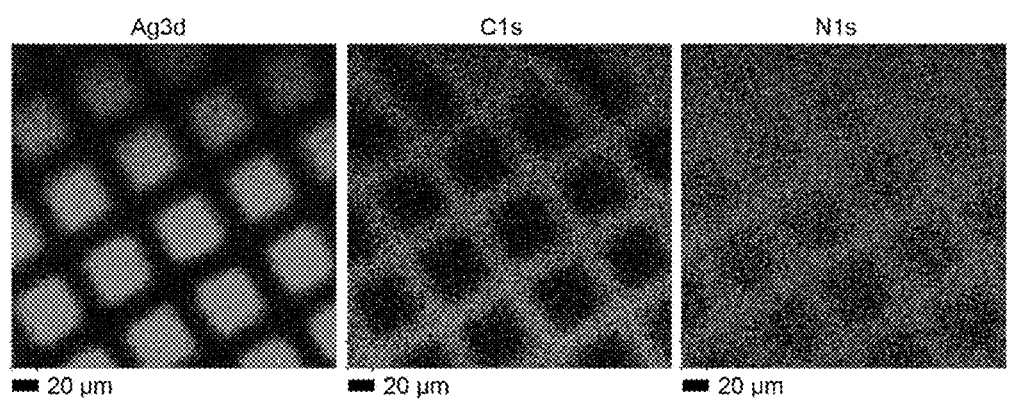
FIG. 17 is an EPS elemental mapping of PVP deposited on 38×26 μm Ag/Si pattern.

To more conclusively show that PVP is selectively deposited in the Si regions and not on the Ag squares of the Ag/Si patterns, XPS elemental mapping was performed. As shown in FIG. 17 for the 38×26 μm pattern, Ag is exclusively confined to the grid squares while C and N corresponding to the PVP polymer are exclusively in the grid lines. Without being bound by theory, it appears that under supersaturated VP monomer conditions, the VP monomer liquid preferentially nucleates on Si. Even if VP liquid happens to form on Si, due to the lack of wettability, the liquid most likely rolls off onto the Si regions where it polymerizes. It is this differential wetting, with the lower surface energy of Ag compared to Si (1.2 vs. 2.1 J/m$^2$), that enables selective and preferential deposition of PVP on Si.

To lend further support for this hypothesis of differential wetting leading to preferential deposition under supersaturation, different metal pair combinations were studied using the 38×26 pm grid size, including Ag/Ti, Ag/Cr, and Ag/Ni. iCVD was carried out under supersaturated conditions at $P_m/P_{sat}$=1.53 (actual iCVD conditions are listed in Table 2). From FIGS. 18a-18c, the SEM images indicate that polymer has selectively deposited in the grid lines of Ti, Cr, or Ni since these materials have higher surface energies (2.0, 2.3, and 2.4 J/m$^2$, respectively vs. 1.2 J/m$^2$ for Ag). This is the same behavior as for the Ag/Si system and demonstrates the broader applicability of the patterning technique based on an understanding of the driving force that leads to selective PVP growth.

Figures 16B, 16C, 16D:
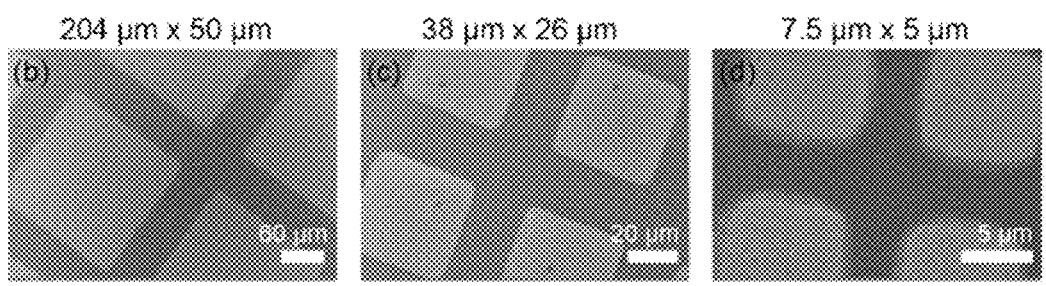
FIG. 16b is an SEM image of PVP deposited on Ag/Si taken under 250× magnification with L x S dimensions of 204×50 μm.
FIG. 16c is an SEM image of PVP deposited on Ag/Si taken under 250× magnification with L x S dimensions of 204×50 μm.
FIG. 16d is an SEM image of PVP deposited on Ag/Si taken under 250× magnification with L×S dimensions of 204×50 μm.
Figures 16E, 16F, 16G:
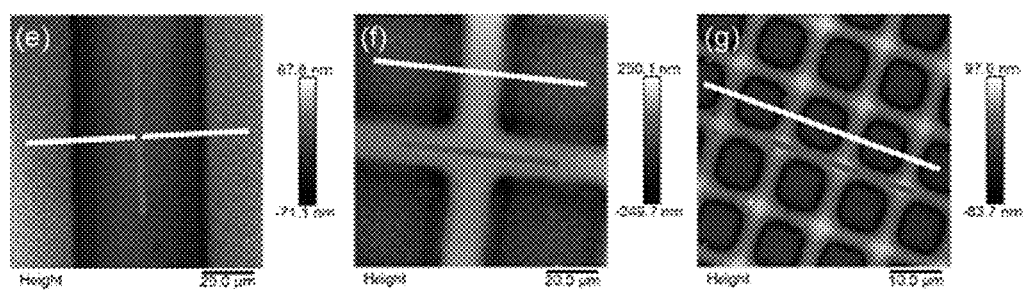
FIG. 16e is an AFM 2D height image corresponding to the SEM image of FIG. 16b.
FIG. 16f is an AFM 2D height image corresponding to the SEM image of FIG. 16c.
FIG. 16g is an AFM 2D height image corresponding to the SEM image of FIG. 16d.

The SEM results for PVP deposited surfaces are displayed in FIGS. 18a-18c. Similar Ag squares, as shown in FIGS. 16b-16d, suggest that PVP selectively wets the higher surface energy material of each pair of materials in the Ag/Ti, Ag/Cr and Ag/Ni samples. In the Ag/Cr sample, a broader boundary appears along with Ag squares. Such a boundary was not observed for the Ag/Ti and Ag/Ni samples. Also, the few dark spots on the Ag surface of Ag/Ti and Ag/Ni samples do not show up on the Ag/Cr sample. These factors may suggest that different compositional surfaces may affect PVP patterning. Overall, FIGS. 18a-18c suggest that wettability is the key factor for controlling the performance of PVP patterning under supersaturated conditions.

Example 5

Patterned Polymers and Directed Polymer Growth of PHEMA by iCVD

To further understand the mechanism of iCVD polymer patterning, another iCVD polymer, PHEMA, was applied to confirm the importance of wettability. The iCVD process as described above in Example 4 for PVP was used here for PHEMA. For PHEMA deposition, the same filament temperature (1.25 A/20.8 V) was applied. HEMA monomer and TBPO initiator source jars were heated separately to 70° C. and 30° C., respectively. TBPO initiator flow rate was kept at 0.05 sccm in all conditions. The HEMA monomer flow rate was 0.4 sccm at substrate temperatures of 38.6° C. and 33.3° C. under 0.1 torr for Pm/Psat of 1.03 and 1.71, respectively. To achieve a higher $P_m/P_{sat}$ of 2.11, HEMA flow was increased to 0.6 sccm accompanied by a higher pressure of 0.15 torr at a Tsub of 35.7° C.

Due to the benefit of better selectivity on the small Ag pattern, 7.5 μm×5 μm Ag/Si samples were selected and deposited with PHMEA using the $P_m/P_{sat}$ conditions given in Table 3.

TABLE 3

PHEMA Conditions

| Parameters | $F_m$ [sccm] | $F_m$ [sccm] | $P_t$ [torr] | $T_{fit}$ [° C.] | $T_{sub}$ [° C.] | $P_m/P_{sat}$ | Size of pattern L × S |
|---|---|---|---|---|---|---|---|
| Value | 0.4 | | 0.10 | | 38.6 | 1.03 | |
| | 0.4 | 0.05 | 0.10 | 270 | 33.3 | 1.71 | 7.5 μm × 5 μm |
| | 0.6 | | 0.15 | | 35.7 | 2.11 | |

The SEM images for the selective deposition of PHEMA are shown in FIGS. 19a-19c. These SEM images show no distinguishable patterns on Ag/Si samples after PHEMA deposition under supersaturated conditions. The poor selectivity of PHEMA can be explained by the fact that the deposition rate of PHEMA is 2~3 times faster than PVP under supersaturated conditions. It is known that the PHEMA deposition rate is about 5 to 6 times faster than PVP23 under iCVD conditions at $P_m/P_{sat}$<1. Thus, the poor selectivity of PHEMA might be caused by a fast reaction rate that dominates the competition between wettability and polymerization so that PHEMA polymerizes too quickly for the selective wetting phenomena to occur. This tends to indicate that a polymer selected for patterning should have a relatively slow reaction rate to prevent the reaction rate from surpassing the wetting rate under iCVD supersaturated conditions.

As used herein and in the appended claims, the singular forms "a", "an", and "the" include plural references unless the context clearly dictates otherwise. As well, the terms "a" (or "an"), "one or more" and "at least one" can be used interchangeably herein. It is also to be noted that the terms "comprising", "including", and "having" can be used interchangeably.

The foregoing examples have been presented for the purpose of illustration and description and are not to be construed as limiting the scope of the invention in any way. The scope of the invention is to be determined from the claims appended hereto.

What is claimed is:

1. A method of forming a patterned polymer layer on a substrate comprising steps of:
    providing a substrate comprising a first surface having a first surface energy and a pattern located on the substrate forming a second surface having a second, lower surface energy than the first surface;
    selectively depositing a polymeric layer onto the first surface using a monomer material in an initiated chemical vapor deposition process carried out in a vacuum reactor kept at a constant pressure between about 0.1 Torr and about 100 Torr with the substrate held at a constant temperature in the range of about −15° C. to about 25° C., and the monomer is introduced to the depositing step at a flow rate between about 0.1 sccm and about 100 sccm, wherein the intitiated chemical vapor deposition process is operated under supersaturation conditions that result in a fractional saturation $P_m/P_{sat}$ of the monomer in the range of greater than 1 to about 2 during the deposition process.

2. The method of claim 1, wherein the first surface energy is at least 10% greater than the second surface energy.

3. The method of claim 1, wherein the first surface energy is at least 10-400% greater than the second surface energy.

4. The method of claim 1, wherein the first surface energy is at least 100% greater than the second surface energy.

5. The method of claim 1, wherein the first surface energy is greater than about 1.5 $J.m^{-2}$.

6. The method of claim 5, wherein the first surface energy is in the range of about 1.7 to about 2.4 $J.m^{-2}$.

7. The method of claim 1, wherein the second, lower surface energy is lower than about 1.5 $J.m^{-2}$.

8. The method of claim 7, wherein the second, lower surface energy is in the range of about 0.7 to about 1.3 $J.m^{-2}$.

9. The method of claim 1, wherein the first surface comprises a material selected from the group consisting of, titanium, chromium, silicon, nickel, and platinum.

10. The method of claim 1, wherein the first surface comprises silicon.

11. The method of claim 10, wherein the second surface comprises silver, gold, or tin.

12. The method of claim 11, wherein the polymer is selected from the group consisting of, poly(methyl methacrylate), poly(styrene), poly(vinylimidazole), and poly(vinylpyrrolidone).

13. The method of claim 1, wherein the contact angle between the monomer and the first surface is lower than 10°.

14. The method of claim 13, wherein the contact angle between the monomer and the second surface is higher than 10°.

15. The method of claim 1, wherein the polymer is poly(vinylpyrrolidone).

16. The method of claim 1, wherein the substrate is made by
    placing a mask onto the first surface to define a pattern;
    depositing the second material having the second surface energy onto the first surface containing the mask; and
    removing the mask.

17. The method of claim 1, wherein the fractional saturation $P_m/P_{sat}$ of the monomer is about 1.2 to about 1.6.

18. A substrate comprising a patterned polymer layer formed by the method of claim 1.

* * * * *